(12) United States Patent
Kobayashi et al.

(10) Patent No.: US 8,647,708 B2
(45) Date of Patent: Feb. 11, 2014

(54) METHOD OF PRODUCING PHOTOELECTRIC CONVERSION ELEMENT, PHOTOELECTRIC CONVERSION ELEMENT, AND PHOTOELECTROCHEMICAL CELL

(75) Inventors: Katsumi Kobayashi, Odawara (JP); Hirotaka Satou, Odawara (JP); Keizo Kimura, Odawara (JP)

(73) Assignee: Fujifilm Corporation, Tokyo (JP)

( * ) Notice: Subject to any disclaimer, the term of this patent is extended or adjusted under 35 U.S.C. 154(b) by 506 days.

(21) Appl. No.: 12/889,928

(22) Filed: Sep. 24, 2010

(65) Prior Publication Data

US 2011/0073187 A1 Mar. 31, 2011

(30) Foreign Application Priority Data

Sep. 28, 2009 (JP) ................................ 2009-223449

(51) Int. Cl.
*B05D 5/12* (2006.01)
*H01L 31/00* (2006.01)
*H01L 21/00* (2006.01)

(52) U.S. Cl.
USPC ......... 427/74; 136/263; 257/E51.041; 438/82

(58) Field of Classification Search
USPC ........................................................ 427/74
See application file for complete search history.

(56) References Cited

U.S. PATENT DOCUMENTS 5,463,057 A 10/1995 Graetzel et al.
5,525,440 A 6/1996 Kay et al.

(Continued)

FOREIGN PATENT DOCUMENTS

JP 07-249790 9/1995
JP 11-3049 1/1999

(Continued)

OTHER PUBLICATIONS

Extended European Search Report dated Feb. 1, 2012, Application No. 10178694.5.

(Continued)

*Primary Examiner* — Michael Cleveland
*Assistant Examiner* — Austin Murata
(74) *Attorney, Agent, or Firm* — Young & Thompson

(57) ABSTRACT

A method of producing a photoelectric conversion element, which the element contains an electrically conductive support, a photosensitive layer having porous semiconductor fine particles, a charge transfer layer; and a counter electrode; containing the steps of:
 applying a semiconductor fine particle dispersion liquid, in which the content of solids excluding semiconductor fine particles is 10% by mass or less based on the total amount of the dispersion liquid, on the support, to form a coating;
 heating the coating, to obtain porous semiconductor fine particles; and
 sensitizing the porous particles by adsorption of the following dye:

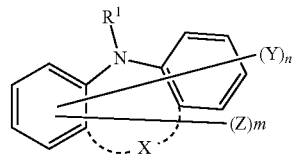

wherein X represents a group of non-metallic atoms necessary for forming a 7-membered ring; Y represents a dye residue; n represents an integer of 1 or more; Z represents a substituent; m represents 0 or a positive integer; and $R^1$ represents a hydrogen atom or a specific substituent.

10 Claims, 1 Drawing Sheet

(56) References Cited

U.S. PATENT DOCUMENTS

2005/0016578 A1* 1/2005 Enomoto et al. .............. 136/243
2006/0016473 A1* 1/2006 Choi et al. .................... 136/263

FOREIGN PATENT DOCUMENTS

| | | |
|---|---|---|
| JP | 2000-178273 | 6/2000 |
| JP | 2002-280587 | 9/2002 |
| JP | 2008-135197 | 6/2008 |
| JP | 2011-026534 | 2/2011 |
| WO | WO 2009/109499 * | 2/2009 |
| WO | 2009/109499 | 9/2009 |

OTHER PUBLICATIONS

Japanese Official Action—2009-223449—Nov. 12, 2013.

* cited by examiner

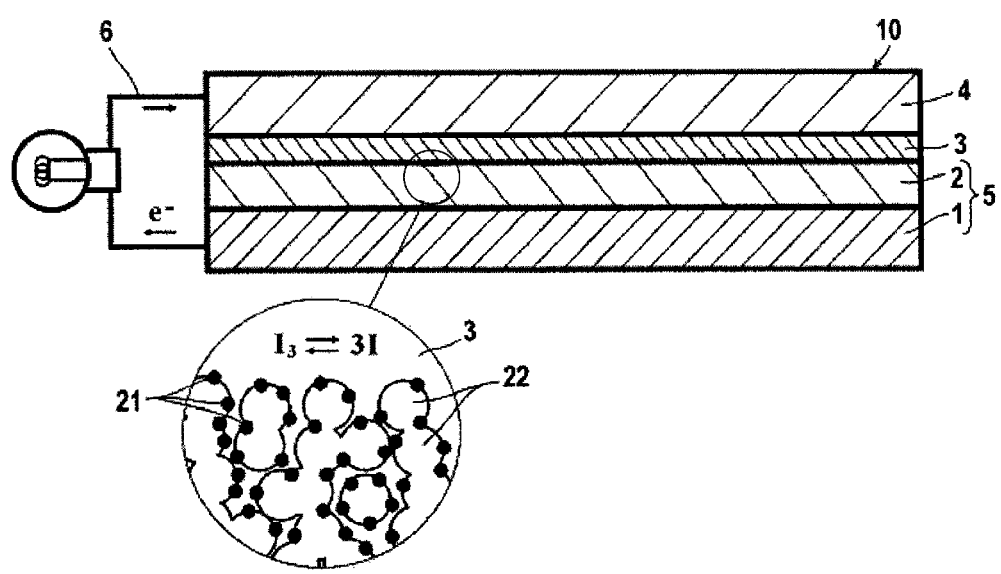

METHOD OF PRODUCING PHOTOELECTRIC CONVERSION ELEMENT, PHOTOELECTRIC CONVERSION ELEMENT, AND PHOTOELECTROCHEMICAL CELL

FIELD OF THE INVENTION

The present invention relates to a method of producing a photoelectric conversion element having high conversion efficiency, a photoelectric conversion element, and a photoelectrochemical cell.

BACKGROUND OF THE INVENTION

Photoelectric conversion elements are used in various photosensors, copying machines, solar cells, and the like. These photoelectric conversion elements have adopted various systems to be put into use, such as elements utilizing metals, elements utilizing semiconductors, elements utilizing organic pigments or dyes, or combinations of these elements. Among them, solar cells that make use of non-exhaustive solar energy do not necessitate fuels, and full-fledged practicalization of solar cells as an inexhaustible clean energy is being highly expected. Under such circumstances, research and development of silicon-based solar cells have long been in progress. Many countries also support policy-wise considerations, and thus dissemination of silicon-based solar cells is still in progress. However, silicon is an inorganic material, and has limitations per se in terms of throughput and molecular modification.

As a next-generation technology to solve such problems as described above, research is being vigorously carried out on dye-sensitized solar cells. Particularly, Graetzel et al. at l'Ecole Polytechnique de l'Universite de Lausanne in Switzerland have developed a dye-sensitized solar cell in which a dye formed from a ruthenium complex is fixed at the surface of a porous titanium oxide thin film, and have realized a conversion efficiency that is comparable to that of amorphous silicon. Thus, they instantly attracted the attention of researchers all over the world.

U.S. Pat. Nos. 5,463,057, 5,525,440 and JP-A-7-249790 ("JP-A" means unexamined published Japanese patent application) describe dye-sensitized photoelectric conversion elements making use of semiconductor fine particles sensitized by a dye, to which the foregoing technology has been applied. These dye-sensitized photoelectric conversion elements are produced by applying a high-viscosity dispersion liquid containing semiconductor fine particles on an electrode support, volatilizing the solvent from the applied dispersion liquid at a relatively high temperature (e.g., 400° C. to 500° C.), and adsorbing a dye thereto. However, the time or energy consumed in this solvent volatilization process poses an obstruction to cost reduction. Furthermore, since the type of the electrode support that supports the semiconductor fine particle layer is limited, it is difficult to form an electrode layer on a plastic substrate or the like.

In regard to this problem, JP-A-2002-280587 describes a method of adsorbing a ruthenium complex dye to semiconductor fine particles, by applying on a support a dispersion liquid in which the content of additives excluding semiconductor fine particles and dispersion solvent is 1% by mass or less of the dispersion liquid, and heating the dispersion liquid coating at 250° C. or below. However, the ruthenium complex dyes used in the sensitized dyes are very expensive. Furthermore, there are concerns about the supply of ruthenium, and it still cannot be said that this technology is satisfactory as a next-generation technology supporting clean energy to cope with the above-described problems in a full-fledged manner. Rather, the research and development intended for practicalization has been just begun to some extent.

For such reasons, development of a photoelectric conversion element which is sensitized by an organic material that is inexpensive and is less restricted in resources, and which has sufficient conversion efficiency, is desired. Reports are beginning to emerge on the use of organic dyes as sensitizers of a photoelectric conversion element (see JP-A-2008-135197). However, this is a method for forming a porous semiconductor fine particle layer at a high temperature of 500° C.

SUMMARY OF THE INVENTION

The present invention resides in a method of producing a photoelectric conversion element, which the photoelectric conversion element comprises a laminated structure including:

an electrically conductive support;

a photosensitive layer having porous semiconductor fine particles that have adsorbed a dye, formed on the electrically conductive support;

a charge transfer layer; and a counter electrode;

comprising the steps of:

applying a semiconductor fine particle dispersion liquid, in which the content of solids excluding semiconductor fine particles is 10% by mass or less based on the total amount of the semiconductor fine particle dispersion liquid, on the electrically conductive support, to form a coating;

heating the coating, to obtain porous semiconductor fine particles; and sensitizing the porous semiconductor fine particles by adsorption of a dye represented by formula (1):

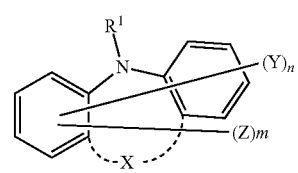

Formula (1)

wherein X represents a group of non-metallic atoms necessary for forming a nitrogen-containing 7-membered ring by linking with the benzene rings; Y represents a dye residue; n represents an integer of 1 or more; Z represents a substituent; m represents zero (0) or a positive integer; when m is an integer of 2 or more, Zs may be identical with or different from each other; and $R^1$ represents a hydrogen atom, an aliphatic group, an aromatic group or a heterocyclic group that is linked with the nitrogen atom via a carbon atom.

Further, the present invention resides in a photoelectric conversion element, which is produced by the method described above.

Further, the present invention resides in a photoelectrochemical cell, comprising the photoelectric conversion element described.

Other and further features and advantages of the invention will appear more fully from the following description, appropriately referring to the accompanying drawing.

BRIEF DESCRIPTION OF THE DRAWINGS

FIG. 1 is a cross-sectional view schematically showing an exemplary embodiment of the photoelectric conversion element produced by the method according to the present invention.

DETAILED DESCRIPTION OF THE INVENTION

The inventors of the present invention conducted thorough investigations, and as a result, they found that when a particular dispersion liquid of semiconductor fine particles is applied and dried on an electrically conductive support, and then the semiconductor fine particles are sensitized with a particular dye, a photoelectrochemical cell having high conversion efficiency can be provided. The present invention was made based on this finding.

According to the present invention, there is provided the following means:

<1> A method of producing a photoelectric conversion element, which the photoelectric conversion element comprises a laminated structure including:
an electrically conductive support,
a photosensitive layer having porous semiconductor fine particles that have adsorbed a dye, formed on the electrically conductive support;
a charge transfer layer; and
a counter electrode;
comprising the steps of:
applying a semiconductor fine particle dispersion liquid, in which the content of solids excluding semiconductor fine particles is 10% by mass or less based on the total amount of the semiconductor fine particle dispersion liquid, on the electrically conductive support, to form a coating;
heating the coating, to obtain porous semiconductor fine particles; and
sensitizing the porous semiconductor fine particles by adsorption of a dye represented by formula (1):

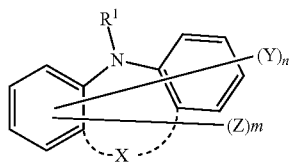

Formula (1)

wherein X represents a group of non-metallic atoms necessary for forming a nitrogen-containing 7-membered ring by linking with the benzene rings; Y represents a dye residue; n represents an integer of 1 or more; Z represents a substituent; m represents zero (0) or a positive integer; when m is an integer of 2 or more, Zs may be identical with or different from each other; and $R^1$ represents a hydrogen atom, an aliphatic group, an aromatic group or a heterocyclic group that is linked with the nitrogen atom via a carbon atom.

<2> The method of producing a photoelectric conversion element described in the above item <1>, wherein the electrically conductive support is formed of an electrically conductive polymeric material.

<3> The method of producing a photoelectric conversion element described in the above item <1> or <2>, wherein the electrically conductive support applied with the semiconductor fine particle dispersion liquid is heated at a temperature ranging from 100° C. to 250° C.

<4> The method of producing a photoelectric conversion element described in any one of the above items <1> to <3>, wherein the dye represented by formula (1) is a dye represented by formula (2):

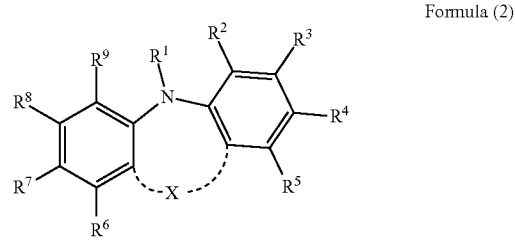

Formula (2)

wherein X represents a group of non-metallic atoms necessary for forming a nitrogen-containing 7-membered ring by linking with the benzene rings; $R^1$ represents a hydrogen atom, an aliphatic group, an aromatic group or a heterocyclic group that is linked with the nitrogen atom via a carbon atom; $R^2$ to $R^9$ each independently represent a hydrogen atom or a substituent; and at least one of $R^2$ to $R^9$ represents a dye residue represented by formula (3) and/or the group of non-metallic atoms represented by X has a dye residue represented by formula (3):

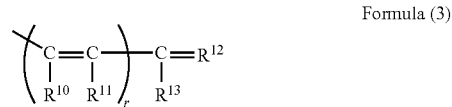

Formula (3)

wherein $R^{10}$, $R^{11}$ and $R^{13}$ each independently represent a hydrogen atom, an aliphatic group, an aromatic group or a heterocyclic group; r represents an integer of 0 or more; the carbon-carbon double bonds in formula (3) may be any of an E-form and a Z-form; and $R^{12}$ represents a group having at least one acidic group, or an acidic nucleus.

<5> The method of producing a photoelectric conversion element described in any one of the above items <1> to <4>, wherein the dye represented by formula (1) or (2) is a dye represented by formula (4):

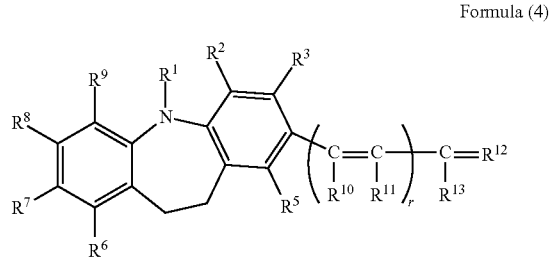

Formula (4)

wherein $R^1$ to $R^3$ and $R^5$ to $R^{13}$ in formula (4) each have the same meaning as those in formula (2) or (3), respectively.

<6> The method of producing a photoelectric conversion element described in any one of the above items <1> to <4>, wherein the dye represented by formula (1) or (2) is a dye represented by formula (5):

Formula (5)

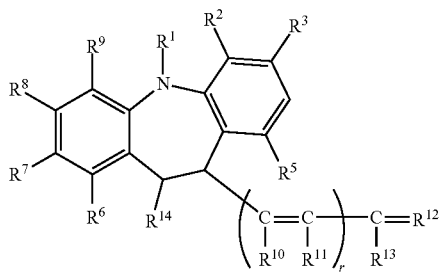

wherein $R^1$ to $R^{13}$ in formula (5) each have the same meaning as those in formula (2) or (3), respectively; and $R^{14}$ represents a hydrogen atom, an alkyl group, an alkoxy group, an alkylthio group, an aryl group, an aryloxy group, an arylthio group or a heterocyclic group.

<7> The method of producing a photoelectric conversion element described in any one of the above items <1> to <4>, wherein the dye represented by formula (1) or (2) is a dye represented by formula (6):

Formula (6)

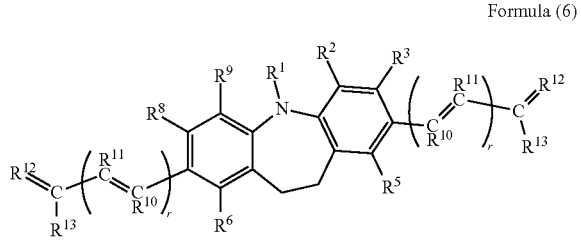

wherein $R^1$ to $R^3$, $R^5$, $R^6$ and $R^8$ to $R^{13}$ in formula (6) each have the same meaning as those in formula (2) or (3), respectively.

<8> The method of producing a photoelectric conversion element described in any one of the above items <4> to <7>, wherein $R^{12}$ in formula (3) is represented by formula (7) or (12):

Formula (7)

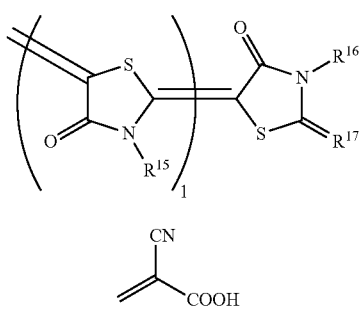

Formula (12)

wherein $R^{15}$ and $R^{16}$ each independently represent an aliphatic group, an aromatic group, or a heterocyclic group, each of which may have an acidic group; l represents 0 or 1; the carbon-carbon double bonds in formula (7) may be any of an E-form or a Z-form; $R^{17}$ represents a sulfur atom or a group represented by formula (9); and at least one of $R^{15}$, $R^{16}$ and $R^{17}$ is a group having at least one acidic group;

Formula (9)

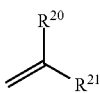

wherein $R^{20}$ and $R^{21}$ each independently represent a cyano group or an acidic group, and may be identical with or different from each other; and the carbon-carbon double bond in formula (9) may be any of an E-form or a Z-form.

<9> The method of producing a photoelectric conversion element described in the above item <8>, wherein the group represented by formula (7) is a group represented by formula (10) or (11):

Formula (10)

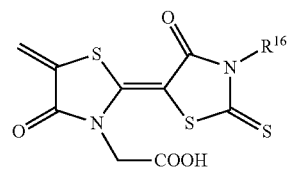

Formula (11)

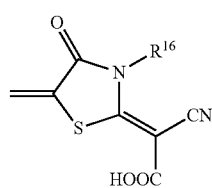

wherein $R^{16}$ has the same meaning as that in formula (7).

<10> A photoelectric conversion element, which is produced by the method described in any one of the above items <1> to <9>.

<11> A photoelectrochemical cell, comprising the photoelectric conversion element described in the above item <10>.

The inventors of the present invention have devotedly conducted investigations, and as a result, they found that a photoelectric conversion element having high conversion efficiency can be produced by producing a photoelectric conversion element by a method including the steps of applying a semiconductor fine particle dispersion liquid in which the content of solids excluding semiconductor fine particles is equal to or less than a particular amount, on an electrically conductive support mentioned above; heating the dispersion liquid coating to obtain porous semiconductor fine particles; and sensitizing the porous semiconductor fine particles with a particular dye.

A preferred exemplary embodiment of the photoelectric conversion element produced by the method of the present invention will be explained with reference to the drawing. As shown in FIG. 1, the photoelectric conversion element 10 includes an electrically conductive support 1; a photosensitive layer 2 provided on the electrically conductive support 1, the photosensitive layer having porous semiconductor fine particles to which a dye has been adsorbed; a charge transfer layer 3; and a counter electrode 4. The electrically conductive support 1 having a photosensitive layer 2 provided thereon functions as a working electrode in the photoelectric conversion element 10. This photoelectric conversion element 10 can be operated as a photoelectrochemical cell (not depicted) by making the element usable in a cell application where the cell is made to work with an external circuit 6.

A light-receiving electrode 5 is an electrode comprising an electrically conductive support 1; and a photosensitive layer (semiconductor film) 2 coated on the electrically conductive support, the layer containing semiconductor fine particles 22 to which a dye 21 has been adsorbed. A light incident to the photosensitive layer (semiconductor film) 2 excites the dye. The excited dye has electrons with high energy, and these electrons are transported from the dye 21 to the conduction band of the semiconductor fine particles 22 and further reach the electrically conductive support 1 by diffusion. At this time, the molecules of the dye 21 are in an oxide form; however, in a photoelectrochemical cell, the electrons on the electrode return to the oxide of the dye while working in the external circuit, while the light-receiving electrode 5 works as a negative electrode of this cell.

The materials used in the photoelectric conversion element of the present invention and the method of producing the photoelectric conversion element will be described below in detail.

(A) Electrically Conductive Support

The method of producing a photoelectric conversion element of the present invention makes use of an electrically conductive support. As the electrically conductive support, a support having electroconductivity per se, such as a metal, or a glass or polymeric material having an electrically conductive layer on the surface can be used. It is preferable that the electrically conductive support is substantially transparent. The terms "substantially transparent" means that the transmittance of light is 10% or more, preferably 50% or more, particularly preferably 80% or more. As the electrically conductive support, a support formed from glass or a polymeric material and coated with an electrically conductive metal oxide is preferable. In this case, the amount of coating of the conductive metal oxide is preferably 0.1 to 100 g per square meter of the support made of glass or a polymeric material. In the case of using a transparent conductive support, it is preferable that light is incident from the support side. Examples of the polymeric material that may be preferably used include tetraacetylcellulose (TAC), polyethylene terephthalate (PET), polyethylene naphthalate (PEN), syndiotactic polystyrene (SPS), polyphenylene sulfide (PPS), polycarbonate (PC), polyarylate (PAR), polysulfone (PSF), polyester sulfone (PES), polyether imide (PEI), cyclic polyolefin, and phenoxy bromide. The electrically conductive support may be provided with a light management function at the surface, and for example, the anti-reflective film having a high refractive index film and a low refractive index oxide film alternately laminated as described in JP-A-2003-123859, and the light guide function as described in JP-A-2002-260746 may be mentioned.

It is preferable to provide the electrically conductive support with a function of blocking ultraviolet light. For instance, there may be mentioned a method of adopting a fluorescent material that is capable of changing ultraviolet light to visible light as described in JP-A-2001-185242, within the transparent support or on the surface of the transparent support. As another preferred method, a method of using an ultraviolet absorbent may also be used. Preferred examples thereof include those described in, for example, JP-A-11-345991, JP-A-2002-25634, JP-A-2003-21769, JP-A-2004-227843, JP-A-2004-349129, JP-A-2002-134178 and JP-A-2003-100358.

The conductive support may also be imparted with the functions described in JP-A-11-250944, JP-A-2003-308892 and JP-A-2003-282163.

Preferred examples of the electrically conductive film include films of metals (for example, platinum, gold, silver, copper, aluminum, rhodium, and indium), carbon, and electrically conductive metal oxides (for example, indium-tin composite oxide, and fluorine-doped tin oxide). Preferred examples of the electrically conductive film and the producing method of the same include those described in, for example, JP-A-2003-151355, JP-A-2004-311174, JP-A-2004-311175, JP-A-2004-311176, JP-A-2005-85699, JP-A-2005-85670, JP-A-2005-116391, JP-A-2003-323818, JP-A-2004-165080, and JP-A-2005-141981.

The thickness of the conductive film layer is preferably 0.01 to 30 μm, more preferably 0.03 to 25 μm, and particularly preferably 0.05 to 20 μm.

In the present invention, an electrically conductive support having lower surface resistance is preferred. The surface resistance is preferably in the range of 50 $\Omega/cm^2$ or less, and more preferably 10 $\Omega/cm^2$ or less. The lower limit of the surface resistance is not particularly limited, but the lower limit is usually about 0.1 $\Omega/cm^2$.

Since the resistance value of the electrically conductive film is increased as the cell area increases, a collecting electrode may be disposed. Preferred examples of the shape and material of the collecting electrode include those described in, for example, JP-A-11-266028, JP-A-2005-108467, JP-A-2003-203681, JP-A-2004-146425, JP-A-2004-128267, JP-A-2004-164970, JP-A-2004-327226, JP-A-2004-164950, JP-A-2005-78857, JP-A-2005-197176, JP-A-2004-164950, JP-A-2000-285977, JP-A-2002-314108, and JP-A-2003-123858.

As described in JP-A-2000-285974, a gas barrier film and/or an ion diffusion preventing film may be disposed between the support and the transparent conductive film. The gas barrier layer may be any of a resin film (see, for example, JP-A-2000-282163 or JP-A-2005-142086) or an inorganic film (see, for example, JP-A-2005-142086).

Furthermore, a transparent electrode and a porous semiconductor electrode photocatalyst-containing layer may also be provided, as described in JP-A-2005-142084 or JP-A-2005-142085.

The transparent conductive layer may have a laminate structure, and preferred examples of the production method include the method of laminating FTO on ITO as described in JP-A-2003-323818, as well as the methods described in JP-A-2005-44544, JP-A-2005-142088, JP-A-2005-19205, JP-A-2004-241228 and JP-A-2004-319872.

(B) Semiconductor Fine Particles

In the method of producing a photoelectric conversion element of the present invention, a semiconductor fine particle dispersion liquid in which the content of solids excluding semiconductor fine particles is 10% by mass or less of the whole semiconductor fine particle dispersion liquid, is applied on the electrically conductive support as described above and heated, and thus porous semiconductor fine particles are obtained.

Regarding the semiconductor fine particles, fine particles of chalcogenides of metals (for example, oxides, sulfides and selenides), or fine particles of perovskites may be used with preference. Preferred examples of the chalcogenides of metals include oxides of titanium, tin, zinc, tungsten, zirconium, hafnium, strontium, indium, cerium, yttrium, lanthanum, vanadium, niobium or tantalum, cadmium sulfide, and cadmium selenide. Preferred examples of the perovskites include strontium titanate, and calcium titanate. Among these, titanium oxide, zinc oxide, tin oxide, and tungsten oxide are particularly preferred.

Semiconductors are classified into n-type semiconductors in which the carrier associated with conduction is electron, or p-type semiconductors in which the carrier is hole. It is preferable to use an n-type semiconductor in the present invention, in view of the conversion efficiency. The n-type semiconductors include an intrinsic semiconductor (or true semiconductor) which does not have an impurity level, and has equal concentrations of the carriers consisting of the conduction band electrons and the valence band holes, as well as an n-type semiconductor having a higher concentration of the electron carrier due to the structural defect originating from impurities. Examples of the n-type inorganic semiconductors that may be preferably used in the present invention include $TiO_2$, $TiSrO_3$, ZnO, $Nb_2O_3$, $SnO_2$, $WO_3$, Si, CdS, CdSe, $V_2O_5$, ZnS, ZnSe, SnSe, $KTaO_3$, $FeS_2$, PbS, InP, GaAs, $CuInS_2$, and $CuInSe_2$. Among these, most preferred examples of the n-type semiconductors include $TiO_2$, ZnO, $SnO_2$, $WO_3$ and $Nb_2O_3$. A composite semiconductor material composed of plural kinds of these semiconductors is also used with preference.

The particle size of the semiconductor fine particles is such that, for the purpose of maintaining the viscosity of the semiconductor fine particle dispersion liquid high, the average particle size of the primary particles is preferably from 2 nm to 50 nm, and it is more preferable that the semiconductor fine particles are ultrafine particles having an average particle size of the primary particles of from 2 nm to 30 nm. Two or more kinds of fine particles having different particle size distributions may be used in mixture, and in this case, it is preferable that the average size of the smaller particles is 5 nm or less. Also, for the purpose of enhancing the light-capturing rate by scattering the incident light, large particles having an average particle size of more than 50 nm can be added at a low proportion based on the ultrafine particles described above. In this case, the content of the large particles is preferably 50% or less, and more preferably 20% or less, by mass of the content of the particles having an average particle size of 50 nm or less. The average particle size of the large particles that are added and mixed for the purpose described above is preferably 100 nm or more, and more preferably 250 nm or more.

In regard to the method for producing semiconductor fine particles, sol-gel methods described in, for example, Sakka, Sumio, "Science of Sol-Gel Processes", Agne Shofu Publishing, Inc. (1998) and Technical Information Institute Co., Ltd., "Thin Film Coating Technology Based on Sol-Gel Processes" (1995); and a gel-sol method described in, for example, Sugimoto, Tadao, "Synthesis of Monodisperse Particles and Control of Size and Shape by Gel-Sol Process, a New Synthesis Method", Materia Japan, Vol. 35, No. 9, pp. 1012-1018 (1996), are preferred. It is also preferable to use a method developed by Degussa GmbH, in which a chloride is hydrolyzed at high temperature in an acid hydride salt to produce an oxide. When the semiconductor fine particles are titanium oxide, the sol-gel method, the gel-sol method, and the method of hydrolyzing a chloride in an acid hydride salt at high temperature, are all preferred, and the sulfuric acid method and chlorine method described in Seino, Manabu, "Titanium Oxide: Material Properties and Application Technologies", Gihodo Shuppan Co., Ltd. (1997) may also be used. Other preferred examples of the sol-gel method include the method described in Barbe et al., Journal of American Ceramic Society, Vol. 80, No. 12, pp. 3157-3171 (1997), and the method described in Burnside et al., Chemistry of Materials, Vol. 10, No. 9, pp. 2419-2425.

In addition to these, examples of the method of producing the semiconductor fine particles include, as preferred methods for producing titania nanoparticles, a method based on flame hydrolysis of titanium tetrachloride (see, for example, JP-T-6-511113 ("JP-T" means searched and published International patent publication)), a method of combusting titanium tetrachloride (see, for example, JP-A-2003-327432), a method of hydrolyzing a stable chalcogenide complex (see, for example, JP-A-2001-85076), hydrolysis of orthotitanic acid (see, for example, JP-A-2004-161589 and JP-A-2004-238213), a method of forming semiconductor fine particles from a soluble portion and an insoluble portion, and then removing by dissolving the soluble portion (see, for example, JP-A-2002-246620), hydrothermal synthesis of an aqueous peroxide solution (see, for example, JP-A-2003-92154), and a method of producing titanium oxide fine particles having a core-shell structure according to a sol-gel method (see, for example, JP-A-2004-10403).

Examples of the crystal structure of titania include structures of anatase type, brookite type and rutile type, and anatase type and brookite type structures are preferred in the present invention. Preferred examples include the structure examples described in JP-A-11-339867, JP-A-2001-43907, and JP-A-2001-43907, and the titania having the above-identified structure described in JP-A-11-339867, JP-A-2001-43907, and JP-A-2001-43907 may be incorporated herein by reference. Preferred examples of the properties of titanium oxide include the examples described in EP 1 338 563, US 2004/0161380, U.S. Pat. Nos. 6,075,203, 6,444,189, 6,720,202, Chinese Patent 1540772(A), JP-A-2001-283942, and JP-A-2001-212457.

It is also acceptable to mix a titania nanotube/nanowire/nanorod with the titania fine particles. Preferred examples thereof include those described in, for example, JP-A-2003-168495, JP-A-2003-251194, JP-A-2004-175586, JP-A-2004-175587, JP-A-2004-175588, JP-A-2004-311354, JP-A-2004-311355, JP-A-2004-319661, and JP-A-2005-162584.

Titania may be doped with a non-metallic element or the like. Preferred examples thereof include those described in, for example, JP-A-2000-235874, JP-A-2003-252624, JP-A-2002-25637, JP-A-2003-187881, JP-A-2003-187882, JP-A-2003-179244, JP-A-2004-87148, JP-A-2004-119279, JP-A-2005-93944, JP-A-2005-64493, JP-A-2003-257507, and JP-A-2003-323920. In addition to the dopants, as additives used with titania, a binder for improving necking, or a surface additive for preventing reverse electron transfer may also be used. Preferred examples of the additives include ITO or SnO particles (see, for example, JP-A-11-283682 and JP-A-2001-345125), whiskers (see, for example, JP-A-2003-163037), a fibrous graphite/carbon nanotube (see, for example, JP-A-2003-163037), a zinc oxide necking coupler (see, for example, JP-A-2003-273381), fibrous materials such as celluloses (see, for example, JP-A-2003-123861), metals (see, for example, JP-A-2000-285975 and JP-A-2001-35551), organosilicon (see, for example, JP-A-2000-294304), dodecyl benzenesulfonate (see, for example, JP-A-2000-260493), charge transfer coupling molecules of silane compounds or the like (see, for example, JP-A-2000-323192 and JP-A-2001-102103), and a potential gradient type dendrimer (see, for example, JP-A-2004-213908).

For the purpose of eliminating surface defects of titania, or the like, titania may be subjected to an acid base treatment or an oxidation reduction treatment before the adsorption of a dye. Preferred examples of the acid base treatment include those described in, for example, JP-A-2000-101106, JP-A-2002-293541, JP-A-2003-297441, JP-A-2003-297442, and JP-A-2004-235240. Furthermore, titania may also be subjected to etching, an oxidation treatment, a hydrogen peroxide treatment, a dehydrogenation treatment, UV-ozone, oxygen plasma or the like, as described in JP-A-8-81222, JP-A-2000-285980, JP-A-2004-158243, JP-A-2004-247104, and the like.

(C) Semiconductor Fine Particle Dispersion Liquid

The method of producing a photoelectric conversion element of the present invention includes a step of obtaining porous semiconductor fine particles by applying a semiconductor fine particle dispersion liquid in which the content of solids excluding semiconductor fine particles is 10% by mass or less of the total amount of the semiconductor fine particle dispersion liquid, on the electrically conductive support mentioned above, and appropriately heating the coated support.

Examples of the method of producing a semiconductor fine particle dispersion liquid include, in addition to the sol-gel method described above, a method of precipitating the semiconductor in the form of fine particles in a solvent upon synthesis and directly using the fine particles; a method of ultrasonicating fine particles, and thereby pulverizing the fine particles into ultrafine particles; a method of mechanically grinding a semiconductor using a mill or a mortar, and pulverizing the ground semiconductor; and the like. As a dispersion solvent, water and/or various organic solvents can be used. Examples of the organic solvent include alcohols such as methanol, ethanol, isopropyl alcohol, citronellol and terpineol; ketones such as acetone; esters such as ethyl acetate; dichloromethane, and acetonitrile.

At the time of dispersing the fine particles, for example, a polymer such as polyethylene glycol, hydroxyethylcellulose or carboxymethylcellulose; a surfactant, an acid or a chelating agent may be used in a small amount as a dispersing aid, as necessary. It is preferable that such a dispersing aid is mostly eliminated before the step of forming a film on the electrically conductive support, by a filtration method, a method of using a separating membrane, or a centrifugation method. The semiconductor fine particle dispersion liquid used in the present invention is such that the content of solids excluding semiconductor fine particles is 10% by mass or less based on the total amount of the dispersion liquid. This concentration is preferably 5% or less, more preferably 3% or less, further preferably 1% or less, furthermore preferably 0.5% or less, and particularly preferably 0.3% or less. In other words, the semiconductor fine particle dispersion liquid may contain a solvent and solids excluding semiconductor fine particles in an amount of 10% by mass or less based on the total amount of the semiconductor fine particle dispersion liquid. In the present, it is preferable that the semiconductor fine particle dispersion liquid is substantially composed of semiconductor fine particles and a dispersion solvent. If the content of solids excluding semiconductor fine particles in the semiconductor fine particle dispersion liquid is too high, the conversion efficiency is decreased, and it is not preferable.

If the viscosity of the semiconductor fine particle dispersion liquid is too high, the dispersion liquid undergoes aggregation, and film formation cannot be achieved. On the other hand, if the viscosity of the semiconductor fine particle dispersion liquid is too low, the liquid flows out, and film formation cannot be achieved. Therefore, the viscosity of the dispersion liquid is preferably 10 to 300 N·s/m$^2$ at 25° C., and more preferably 50 to 200 N·s/m$^2$ at 25° C.

In regard to the method of applying the semiconductor fine particle dispersion liquid, a roller method, a dipping method or the like can be used as a method involving application. Furthermore, an air knife method, a blade method or the like can be used as a method involving metering. As a method that can equally utilize a method involving application and a method involving metering, a wire bar method disclosed in JP-B-58-4589 ("JP-B" means examined Japanese patent publication), an extrusion method, a curtain method and a slide hopper method described in U.S. Pat. Nos. 2,681,294, 2,761,419 and 2,761,791, and the like are preferred. It is also preferable to apply the dispersion liquid by a spinning method or a spray method, using a versatile machine. Preferred examples of a wet printing method include the three major printing methods of relief printing, offset printing and gravure printing, as well as intaglio printing, rubber plate printing, screen printing and the like. Among these, a preferable film forming method is selected in accordance with the liquid viscosity or the wet thickness. Furthermore, since the semiconductor fine particle dispersion liquid used in the present invention has high viscosity and has viscidity, the fine particle dispersion liquid often has a strong cohesive power, and may not have good affinity to the support upon coating. Under such circumstances, when surface cleaning and hydrophilization are carried out through a UV-ozone treatment, the affinity between the applied semiconductor fine particle dispersion liquid and the surface of the electrically conductive support increases, and thus it becomes easier to apply the semiconductor fine particle dispersion liquid.

The thickness of the entire semiconductor fine particle layer is preferably 0.1 to 100 μm, more preferably 1 to 30 μm, and even more preferably 2 to 25 μm. The amount of the coated semiconductor fine particles per square meter of the support is preferably 0.5 to 400 g, and more preferably 5 to 100 g.

The applied layer of semiconductor fine particles is subjected to a heating treatment, for the purpose of reinforcing the electronic contact between semiconductor fine particles and enhancing the adhesiveness of the semiconductor fine particles to the support, and also in order to dry the applied semiconductor fine particle dispersion liquid. The porous semiconductor fine particle layer can be formed by this heating treatment, and thus conventional calcination processes are not needed. Although the temperature range for the heating treatment is not particularly limited, the temperature is preferably from 100° C. to 250° C. When a support having a low melting point or a low softening point is used as the electrically conductive support, it is preferable, as far as possible, to set the heat treatment temperature at 150° C. or less.

Furthermore, light energy can also be used in addition to the heating treatment. For example, when titanium oxide is used for the semiconductor fine particles, the surface may be activated by providing the light that is absorbed by the semiconductor fine particles, such as ultraviolet light, or only the surface of the semiconductor fine particles can be activated with a laser light or the like. When the semiconductor fine particles are irradiated with a light that is absorbed by the fine particles, the impurities adsorbed to the particle surfaces are decomposed as a result of activation of the particle surfaces, and a state preferable for the purpose described above can be attained. In the case of using the heating treatment and ultraviolet light in combination, the heating is carried out at a temperature of preferably from 100° C. to 250° C., more preferably from 100° C. to 150° C. As such, by inducing photoexcitation of the semiconductor fine particles, the impurities incorporated in the fine particle layer can be washed away by photodecomposition, and the physical bonding between the fine particles can be reinforced.

In addition to the processes of applying the semiconductor fine particle dispersion liquid on the electrically conductive support and subjecting the semiconductor fine particles to heating or light irradiation, other treatments may also be carried out. Preferred examples of such treatments include the passage of electric current, chemical treatment, and the like.

It is also acceptable to apply pressure after coating, and examples of the method of applying pressure include the methods described in JP-T-2003-500857, JP-A-2002-93475, JP-A-2003-282160 and JP-A-2004-214129. Examples of the light irradiation method include the methods described in JP-A-2001-357896, JP-A-11-219734, JP-A-2004-314313, JP-A-2005-142446, and JP-A-2001-247314. Examples of the methods utilizing plasma, microwaves or electric current include the methods described in JP-A-2002-353453, JP-A-2003-308893, JP-A-2004- 265662, JP-A-2004-327369, JP-A-2004-342319, JP-A-2005-116415, JP-A-2005-139498, and JP-A- 2004- 273770. Examples of the chemical treatment include the methods described in JP-A-2001-357896, JP-A-2002-280327, JP-A-2003-281947, JP-T-2005-520314 and JP-A-2003-297442.

The method of coating the semiconductor fine particles on the electrically conductive support is included in the (1) wet methods, such as a method of applying a semiconductor fine particle dispersion liquid on an electrically conductive support; and a method of applying a precursor of the semiconductor fine particles on an electrically conductive support, hydrolyzing the precursor under the action of the moisture in air, and thereby obtaining a semiconductor fine particle film, as described in Japanese Patent No. 2664194. In regard to the production methods under the class of wet method, examples of the method of preparing a dispersion liquid of semiconductor fine particles include, in addition to the methods described above, a method of pulverizing fine particles in a mortar; a method of dispersing fine particles while pulverizing the particles using a mill; a method of precipitating fine particles in a solvent upon synthesizing a semiconductor, and directly using the precipitates; and the like. Preferred examples thereof include those described in, for example, JP-A-11-144772, JP-A-2005-100792, EP 1 300 897 A1, JP-A-2002-324591, JP-A-2002-145615, JP-A-2003-176130, and JP-A-2004-79610. The dispersion medium for the coating liquid used in the (1) wet methods may be water, or various organic solvents (for example, methanol, ethanol, t-butanol, dichloromethane, acetone, acetonitrile and ethyl acetate). Preferred examples thereof include those described in, for example, JP-T-6-511113 ("JP-T" means published searched patent publication), CN Patent No. 144292, JP-A-11-11912, JP-A-2000-294814, JP-A-2000-319018, JP-A-2000-319018, JP-A-2000-319018, JP-A-2002-145614, JP-A-2002-75477, JP-A-2004-193321, WO 02/067357, JP-A-2004-207205, JP-A-2004-111348, JP-A-2004-186144, JP-A-2003-282162, JP-A- 2005-142011, JP-A-2005-174695, JP-A-2005-85500, JP-A-11-343118, JP-A-11-354169, JP-A-2000-106222, JP-A-2003-246621, JP-A-2003-51345, JP-A-2004-158551, JP-A-2001-358348, and JP-A-2003-217693. Upon dispersing the semiconductor fine particles, a polymer, a surfactant, an acid, a chelating agent or the like may be used as a dispersing aid as necessary, if used in a small amount.

As the method of coating semiconductor fine particles on an electrically conductive support, (2) dry methods and (3) other methods may be used together with the (1) wet methods described above.

Preferred examples of the (2) dry methods include the methods described in JP-A-2000-231943, JP-A-2002-170602, JP-A-2001-345124, JP-A-2003-197280, JP-A-2003-123854, JP-A-2003-123852, JP-A-2003-123853, JP-A-2005-39013, JP-A-2004-39286, and JP-A-2005-104760.

Preferred examples of the (3) other methods include the methods described in JP-A-2002-134435, US 2004/0123896, JP-A-2004-327265, JP-A-2004-342397, JP-T-2003-500857, JP-A-2005-85491, JP-A-2003-98977, JP-A-2002-299665, JP-A-2003-243053, JP-A-2004-253331, JP-A-11-310898, JP-A-2003-257507, JP-A-2003-323920, US 2004/0084080, US 2004/0121068, JP-A-2004-319873, JP-A-10-112337, JP-A-11-6098, JP-A-2000-178791, JP-A-2000-178792, JP-A-2004-103420, and JP-A-2003-301283.

It is preferable for the semiconductor fine particles to have a large surface area, so that a large amount of dye can adsorb to the surface. For example, while the semiconductor fine particles have been coated on the support, the surface area is preferably 10 times or more, and more preferably 100 times or more, relative to the projected surface area. The upper limit of this value is not particularly limited, but the upper limit is usually about 5000 times. Preferred examples of the structure of the semiconductor fine particles include the structures disclosed in JP-A-2001-93591, JP-A-2001-257012, JP-A-2001-196106, JP-A-2001-273936, and EP No. 1207572 A1.

In general, as the thickness of the semiconductor fine particle layer increases, the amount of dye that can be supported per unit area increases, and therefore, the light absorption efficiency is increased. However, since the diffusion distance of generated electrons increases along, the loss due to charge recombination is also increased. Although a preferred thickness of the semiconductor fine particle layer may vary with the utility of the element, the thickness is typically 0.1 to 100 μm. In the case of using the photoelectric conversion element as a photoelectrochemical cell, the thickness of the semiconductor fine particle layer is preferably 1 to 50 μm, and more preferably 3 to 30 μm. The semiconductor fine particles may be calcined after being applied on the support, at a temperature of 100 to 800° C. for 10 minutes to 10 hours, so as to bring about cohesion of the particles.

When a glass support is used, the film forming temperature is preferably 400 to 600° C. When a plastic support is used, it is preferable to form a film at 300° C. or less, more preferably 200° C. or less. The method of forming a film at 200° C. or less may be any of (1) a wet method, (2) a dry method, and (3) an electrophoresis method (including an electrocrystallization method); preferably (1) a wet method or (2) a dry method; and more preferably (1) a wet method.

The wet method is a method of forming a film on a plastic film by applying a semiconductor layer or a precursor thereof in a wet manner or the like, and further activating the semiconductor film. Examples of the wet method include the method of heating a mixture of a semiconductor and an electrically conductive compound at low temperature as described in JP-A-10-290018; a method of utilizing a precursor (examples of the precursor include $(NH_4)_2TiF_6$ described in JP-A-2001-110462; titanium peroxide described in JP-A-2001-247314; and a metal alkoxide, a metal complex and an organic acid metal salt described in JP-A-11-219734); a method of applying a slurry additionally containing a metal organic oxide (alkoxide or the like), and forming a semiconductor film by a heating treatment, a light treatment or the like, as described in JP-T-2005-520314; and a method of characterizing the pH of the slurry additionally containing an inorganic precursor described in JP-A-2003-2819847, and the slurry described in JP-A-2005-56627, and the properties and state of the dispersed titania particles.

These slurries may be added with a small amount of binder, Examples of the binder include the celluloses described in JP-A-2003-109678 or JP-A-2003-123861; the fluoropolymers described in JP-A-2003-272722; the crosslinked rubber described in JP-A-2004-47261; the polybutyl titanate described in JP-T-2005-516365; and the carboxymethylcellulose described in JP-A-2005-135798.

Examples of the technique related to the formation of a layer of a semiconductor or a precursor thereof include a method of hydrophilizing the layer by a physical method using corona discharge, plasma, UV or the like; a chemical treatment based on an alkali (see, for example, JP-A-2004-

119120) or on polyethylene dioxythiophene and polystyrenesulfonic acid (see, for example, JP-A-2005-169228) or the like; formation of an intermediate film for bonding of polyaniline or the like as described in JP-A-2003-297443.

Examples of the dry method include deposition, sputtering, an aerosol deposition method, and the like. Preferred examples thereof include methods described in, for example, JP-A-2005-39013, JP-A-2004-074609, Japanese Patent No. 3265481, JP-A-2003-100359, and JP-A-2004-39286.

Furthermore, the electrophoresis method and the electrocrystallization method described in JP-A-2002-100146 and JP-A-2004-311354 may also be used.

Furthermore, a method of first preparing a DSC on a heat resistant base, and then transferring the DSC to a film made of plastic or the like, may be used. Preferably, a method of transferring a semiconductor layer through EVA as described in JP-A-2002-184475; a method of forming a semiconductor layer and a conductive layer on a sacrificing base containing an inorganic salt that can be removed by ultraviolet rays or a water-based solvent, subsequently transferring the layers to an organic base, and removing the sacrificing base as described in JP-A-2003-98977; and the like may be used.

The amount of coating of the semiconductor fine particles per square meter of the support is preferably 0.5 to 500 g, and more preferably 5 to 100 g.

(D) Photosensitive Layer

In the method of producing a photoelectric conversion element of the present invention, a photosensitive layer can be obtained by adsorbing a particular dye to a porous semiconductor fine particle layer which has been obtained by applying the semiconductor fine particle dispersion liquid described above, on the electrically conductive support described above, and heating the semiconductor fine particle layer. The photosensitive layer is designed according to the purpose, and may have a single layer constitution or a multi-layer constitution. Furthermore, the dye in the photosensitive layer may be of one kind or may be a mixture of plural kinds, but the (E) dye that will be described below is used for at least one kind of the plural kinds. The photosensitive layer of the photoelectric conversion element produced by the method of the present invention contains semiconductor fine particles having this dye adsorbed thereto, and has high sensitivity. When the photoelectric conversion element is used as a photoelectrochemical cell, a high conversion efficiency can be obtained.

(E) Dye

The method of producing a photoelectric conversion element of the present invention includes a step of sensitizing the porous semiconductor fine particles obtained by the process described above, with a specific dye. A photoelectric conversion element produced by a method including a step of sensitizing porous semiconductor fine particles by adsorption of a dye (dye compound) represented by formula (1), can exhibit high photoelectric conversion efficiency.

Formula (1)

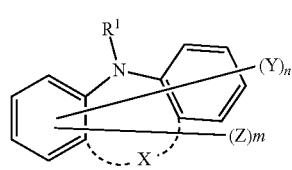

In formula (1), X represents a group of non-metallic atoms necessary for forming a nitrogen-containing 7-membered ring by linking with the benzene rings. Here, the term "group of non-metallic atoms" means a group of atoms bonded by at least one kind of member selected from the group consisting of carbon, oxygen, nitrogen and sulfur atoms.

In formula (1), Y represents a dye residue. Here, the term "dye residue" means a group of atoms needed for constituting a dye as a whole, together with the structure other than Y in formula (1). Examples of the dye formed by Y include polymethine dyes such as merocyanine, hemicyanine, styryl, oxonol and cyanine; diarylmethines such as acridine, xanthene, and thioxanthene; triarylmethine, coumarin, indoaniline, indophenol, diazine, oxazine, thiazine, diketopyrrolopyrrole, indigo, anthraquinone, perylene, quinacridone, naphthoquinone, bipyridyl, terpyridyl, tetrapyridyl, and phenanthroline. Preferred examples include polymethine dyes and polyaryl dyes.

n represents an integer of 1 or more, preferably 1 to 2.

Z represents a substituent, and examples thereof include an aliphatic group, an aromatic group, a heterocyclic group or the like. Specific examples of the substituent include an alkyl group having 1 to 50 carbon atoms (preferably 1 to 25 carbon atoms), an alkoxy group having 1 to 50 carbon atoms (preferably 1 to 25 carbon atoms), an alkylthio group having 1 to 50 carbon atoms (preferably 1 to 25 carbon atoms), an aryl group having 6 to 50 carbon atoms (preferably 6 to 30 carbon atoms), an aryloxy group having 6 to 50 carbon atoms (preferably 6 to 30 carbon atoms), an arylthio group having 6 to 50 carbon atoms (preferably 6 to 30 carbon atoms), and a 3- to 10-membered (preferably 5- to 7-membered) heterocyclic ring having 1 to 30 carbon atoms (preferably 1 to 20 carbon atoms). Preferred examples include an alkyl group having 1 to 25 carbon atoms (for example, methyl, ethyl, n-butyl, n-hexyl, isobutyl, sec-butyl, t-butyl, n-dodecyl, cyclohexyl, or benzyl), an aryl group having 6 to 30 carbon atoms (for example, phenyl, tolyl, or naphthyl), and an alkoxy group having 1 to 25 carbon atoms (for example, methoxy, ethoxy, isopropoxy or butoxy).

m represents 0 or a positive integer. The substituents represented by Z may be identical or different, when m is 2 or more. m is preferably 0, 1, or 2.

$R^1$ represents a hydrogen atom, an aliphatic group, an aromatic group, or a heterocyclic group that is linked via a carbon atom. Specific preferred examples of $R^1$ include a substituted or unsubstituted alkyl group having 1 to 20 carbon atoms (preferably 1 to 18 carbon atoms) (for example, methyl, ethyl, n-butyl, n-hexyl, isobutyl, sec-butyl, t-butyl, n-dodecyl, cyclohexyl or benzyl), a substituted or unsubstituted aryl group having 6 to 50 carbon atoms (preferably 6 to 30 carbon atoms) (for example, phenyl, tolyl or naphthyl), a 3- to 10-membered (preferably 5- to 7-membered) substituted or unsubstituted heterocyclic residue having 1 to 30 carbon atoms (preferably 1 to 20 carbon atoms) (for example, pyridyl, imidazolyl, furyl, thienyl, oxazolyl, thiazolyl, benzimidazolyl, or quinolyl), and a substituted or unsubstituted alkoxy group having 1 to 20 carbon atoms (preferably 1 to 18 carbon atoms) (for example, methoxy, ethoxy, n-butoxy, n-propyloxy, isobutyloxy, sec-butyloxy, t-butyloxy, n-hexyloxy). A more preferred example of $R^1$ is a substituted or unsubstituted alkyl group having 1 to 20 carbon atoms (for example, methyl, ethyl, n-butyl, n-hexyl, isobutyl, sec-butyl, t-butyl, n-dodecyl, cyclohexyl, or benzyl).

In the present invention, the dye represented by formula (1) is a dye represented by formula (2). The dye represented by formula (2) will be described below in detail.

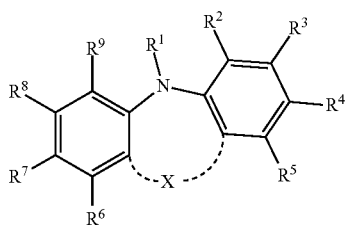

Formula (2)

In formula (2), X and $R^1$ have the same meaning as those in formula (1), respectively, and preferable ranges thereof are also the same.

$R^2$ to $R^9$ each represent a hydrogen atom or a substituent. Specific examples of the substituent include an alkyl group having 1 to 50 carbon atoms (preferably 1 to 25 carbon atoms), an alkoxy group having 1 to 50 carbon atoms (preferably 1 to 25 carbon atoms), an alkylthio group having 1 to 50 carbon atoms (preferably 1 to 25 carbon atoms), an aryl group having 6 to 50 carbon atoms (preferably 6 to 30 carbon atoms), an aryloxy group having 6 to 50 carbon atoms (preferably 6 to 30 carbon atoms), an arylthio group having 6 to 50 carbon atoms (preferably 6 to 30 carbon atoms), and a 3- to 10-membered (preferably 5- to 7-membered) heterocyclic ring having 1 to 30 carbon atoms (preferably 1 to 20 carbon atoms). Preferred examples include an alkyl group having 1 to 25 carbon atoms (for example, methyl, ethyl, n-butyl, n-hexyl, isobutyl, sec-butyl, t-butyl, n-dodecyl, cyclohexyl, or benzyl), an aryl group having 6 to 30 carbon atoms (for example, phenyl, tolyl, or naphthyl), and an alkoxy group having 1 to 25 carbon atoms (for example, methoxy, ethoxy, isopropoxy or butoxy).

In formula (2), at least one of $R^2$ to $R^9$ represents a dye residue represented by formula (3) and/or the group of non-metallic atoms represented by X has a dye residue represented by formula (3).

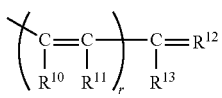

Formula (3)

In formula (3), $R^{12}$ represents a group having at least one acidic group, or an acidic nucleus substituted with at least one acidic group.

Examples of the acidic nucleus include those described in, for example, T. H. James, "The Theory of the Photographic Process, 4th edition", Macmillan publishing, 1977, p. 199.

When $R^{12}$ has at least one acidic group, it is preferable that $R^{12}$ simultaneously has an electron-withdrawing group, and the electron-withdrawing group may be a substituent having the effects described below (–I effect and –M effect). When $R^{12}$ has an acidic group and an electron-withdrawing group, the type or bonding position of the electron-withdrawing group is appropriately selected so as to exhibit an effect that the overlap of the molecular orbital in the excited state of the dye and the light-receiving electrode seems to increase.

In general, an electron-withdrawing group attenuates the electron density at a particular position of a molecule. The electron-withdrawing property or electron-donating property cannot be explained only by the difference in the electronegativity. That is, since an excitation effect, a mesomeric effect and the like work together in a compositive manner, the manifestation of the electron-withdrawing property or the electron-donating property can vary with the aromaticity, presence of a conjugated system, or a topological positional relationship. As an experimental rule for quantitatively evaluating and predicting these effects on the basis of the acid dissociation constant of para- and meta-substituted benzoic acid, there is known Hammett's rule. In the case of the excitation effect, the electron-withdrawing effect is referred to as the –I effect, while the electron-donating effect is referred to as the +I effect, and an atom having higher electronegativity than carbon exhibits the –I effect. Furthermore, an anion exhibits the +I effect, while a cation exhibits the –I effect. In the case of the mesomeric effect, the electron-withdrawing effect is referred to as the –M effect, while the electron-donating effect is referred to as the +M effect. Examples of the electron-withdrawing group are shown below.

Excitation effect (–$I$ effect)

$-O^+R_2 > -N^+R_3$ $-N^+R_3 > -P^+R_3 > \ldots$ $-O^+R_2 > -S^+R_2 > \ldots$ $-N^+R_3 > -NO_2 > -SO_2R > -SOR$ $-SO_2R > -SO_3R$ $-N^+R_3 > -NR_2$ $-O^+R_2 > -OR$ $-S^+R_2 > -SR$ $-F > -Cl > -Br > -I$ $=O >= NR >= CR_2$ $=O > -OR$ $\equiv N > \equiv CR$ $\equiv N >= NR > -NR_2$ $-C \equiv CR > -CR = CR_2 > -CR_2CR_3$ Mesomeric effect (–$M$ effect)

$=N^+R_3 >= NR$ $=O >= NR >= CR_2$ $=S >= O \equiv N$

Preferred examples of the acidic nucleus include a rhodanine nucleus, hydantoin, thiohydantoin, barbituric acid, pyrazolidinedione, pyrazolone, and indanedione. These may contain two or more acidic nuclei linked together, with each acidic nucleus having been dehydrated and condensed at the carbonyl moiety. Preferred examples include rhodanine, hydantoin, thiohydantoin, barbituric acid and pyrazolidinedione, and rhodanine is particularly preferred among them.

The acidic group contained in $R^{12}$ represents a proton-dissociative group having a pKa of 13 or lower. Specific preferred examples of the acidic group include a carboxy group, a sulfo group, and a phosphate group. A more preferred example of the acidic group is a carboxy group.

In formula (3), $R^{10}$, $R^{11}$ and $R^{13}$ each independently represent a hydrogen atom, an aliphatic group, an aromatic group or a heterocyclic group. $R^{10}$, $R^{11}$ and $R^{13}$ each are preferably a hydrogen atom, an aliphatic group or an aromatic group; more preferably an aliphatic group or an aromatic group. Specific preferred examples of $R^{10}$, $R^{11}$ and $R^{13}$ include a hydrogen atom, a substituted or unsubstituted alkyl group having 1 to 20 carbon atoms (preferably 1 to 18 carbon atoms) (for example, methyl, ethyl, n-butyl, n-hexyl, isobutyl, sec-butyl, t-butyl, n-dodecyl, cyclohexyl or benzyl), a substituted or unsubstituted aryl group having 6 to 50 carbon atoms (preferably 6 to 30 carbon atoms) (for example, phenyl, tolyl or naphthyl), a 3- to 10-membered (preferably 5- to 7-membered) substituted or unsubstituted heterocyclic residue having 1 to 30 carbon atoms (preferably 1 to 20 carbon atoms) (for example, pyridyl, imidazolyl, furyl, thienyl, oxazolyl, thiazolyl, benzimidazolyl, or quinolyl), and a substituted or unsubstituted alkoxy group having 1 to 20 carbon atoms (preferably 1 to 18 carbon atoms) (for example, methoxy, ethoxy, n-butoxy, n-propyloxy, isobutyloxy, sec-butyloxy, t-butyloxy, n-hexyloxy). A more preferred example of $R^{10}$, $R^{11}$ and $R^{13}$ is a substituted or unsubstituted alkyl group having 1 to 20 carbon atoms (for example, methyl, ethyl, n-butyl, n-hexyl, isobutyl, sec-butyl, t-butyl, n-dodecyl, cyclohexyl, or benzyl) and a substituted or unsubstituted aryl group having 6 to 20 carbon atoms (for example, phenyl, tolyl or naphthyl).

r represents an integer of 0 or more, preferably an integer of 1 to 4.

The carbon-carbon double bond in formula (3) may be any of an E-form double bond and a Z-form double bond.

In the present invention, the dye represented by formula (1) or formula (2) is preferably a dye represented by any one of formulae (4) to (6). The dyes represented by any one of formulae (4) to (6) will be described below in detail.

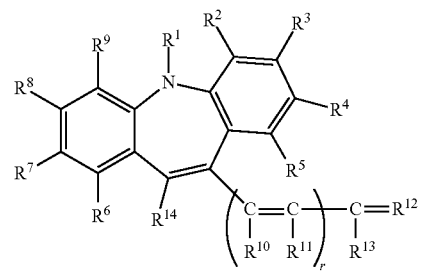

Formula (5)

The dye represented by formula (5) has a carbon-carbon double bond in the nitrogen-containing 7-membered ring, and has a dye residue on the nitrogen-containing 7-membered ring.

In formula (5), $R^{14}$ represents a hydrogen atom, an alkyl group (preferably having 1 to 25 carbon atoms), an alkoxy group (preferably having 1 to 25 carbon atoms), an alkylthio group (preferably having 1 to 25 carbon atoms), an aryl group (preferably having 6 to 30 carbon atoms), an aryloxy group (preferably having 6 to 30 carbon atoms), an arylthio group (preferably having 6 to 30 carbon atoms), or a 3- to 10-membered heterocyclic group (preferably having 1 to 30 carbon atoms). $R^{14}$ is preferably an alkyl group having 1 to 25 carbon atoms (for example, methyl, ethyl, n-butyl, n-hexyl, isobutyl, sec-butyl, t-butyl, n-dodecyl, cyclohexyl or benzyl), an aryl group having 6 to 30 carbon atoms (for example, phenyl, tolyl or naphthyl), or an alkoxy group having 1 to 25 carbon atoms (for example, methoxy, ethoxy, isopropoxy or butoxy).

$R^1, R^2, R^3, R^4, R^5, R^6, R^7, R^8$ and $R^9$ in formula (5) have the same meaning as those in formula (2), respectively, and preferable ranges thereof are also the same. $R^{10}, R^{11}, R^{12}, R^{13}$ and r in formula (5) have the same meaning as those in formula (3), respectively, and preferable ranges thereof are also the same.

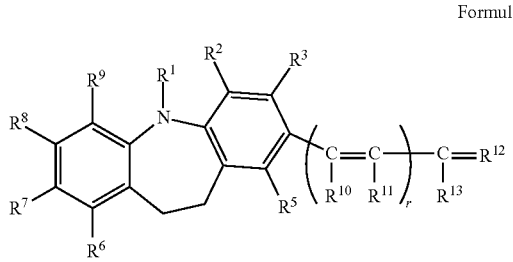

Formula (4)

The dye represented by formula (4) is a dye where X in formula (1) represents an ethylene group, and a nitrogen-containing 7-membered ring structure has been formed thereby. Furthermore, one of the benzene rings substituted with a nitrogen atom has one dye residue at the para-position.

$R^1, R^2, R^3, R^5, R^6, R^7, R^8$ and $R^9$ in formula (4) have the same meaning as those in formula (2), respectively, and preferable ranges thereof are also the same. $R^{10}, R^{11}, R^{12}, R^{13}$ and r in formula (4) have the same meaning as those in formula (3), respectively, and preferable ranges thereof are also the same.

Formula (6)

The dye represented by formula (6) is a dye where X in formula (1) represents an ethylene group, and a nitrogen-containing 7-membered ring structure has been formed thereby. Each of the two benzene rings substituted with a nitrogen atom has one dye residue at the para-position.

$R^1, R^2, R^3, R^5, R^6, R^8$ and $R^9$ in formula (6) have the same meaning as those in formula (2), respectively, and preferable ranges thereof are also the same. $R^{10}, R^{11}, R^{12}, R^{13}$ and r in formula (6) have the same meaning as those in formula (3), respectively, and preferable ranges thereof are also the same.

In formulas (3) to (6), $R^{12}$ is preferably a group represented by formula (7) or formula (12). The group represented by formula (7) or formula (12) will be described in detail.

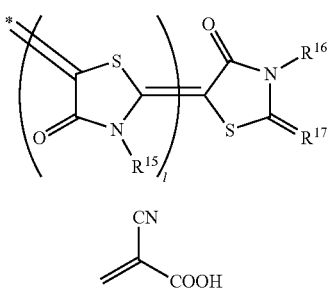

Formula (7)

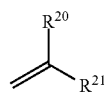

Formula (12)

In formula (7), $R^{15}$ and $R^{16}$ each independently represent an aliphatic group, an aromatic group or a heterocyclic group, each of which may have an acidic group. 1 represents 0 or 1. The carbon-carbon double bond in formula (7) may be any of an E-form double bond and a Z-form double bond. $R^{17}$ represents a sulfur atom or a group represented by formula (9). At least one of $R^{15}$, $R^{16}$ and $R^{17}$ is a group having at least one acidic group.

Formula (9)

In formula (9), $R^{20}$ and $R^{21}$ each independently represents a cyano group or an acidic group, and $R^{20}$ and $R^{21}$ may be identical with or different from each other.

Examples of the aliphatic group, the aromatic group or and the heterocyclic group represented by $R^{15}$ and $R^{16}$ include an alkyl group having 1 to 50 carbon atoms (preferably 1 to 25 carbon atoms), an alkoxy group having 1 to 50 carbon atoms (preferably 1 to 25 carbon atoms), an alkylthio group having 1 to 50 carbon atoms (preferably 1 to 25 carbon atoms), an aryl group having 6 to 50 carbon atoms (preferably 6 to 30 carbon atoms), an aryloxy group having 6 to 50 carbon atoms (preferably 6 to 30 carbon atoms), an arylthio group having 6 to 50 carbon atoms (preferably 6 to 30 carbon atoms), and a 3- to 10-membered (preferably 5- to 7-membered) heterocyclic ring having 1 to 30 carbon atoms (preferably 1 to 20 carbon atoms). Preferred examples include an alkyl group having 1 to 25 carbon atoms (for example, methyl, ethyl, n-butyl, n-hexyl, isobutyl, sec-butyl, t-butyl, n-dodecyl, cyclohexyl, or benzyl), an aryl group having 6 to 30 carbon atoms (for example, phenyl, tolyl, or naphthyl), and an alkoxy group having 1 to 25 carbon atoms (for example, methoxy, ethoxy, isopropoxy or butoxy).

Specific preferred examples of the acidic group that $R^{15}$, $R^{16}$ and $R^{17}$ may have include a carboxy group, a sulfo group, and a phosphate group. A more preferred example of the acidic group is a carboxy group.

When $R^{17}$ represents a sulfur atom, at least one of $R^{15}$ and $R^{16}$ is an aliphatic group, an aromatic group or a heterocyclic group, each having an acidic group, and $R^{15}$ and $R^{16}$ may be different from each other.

The carbon-carbon double bond in formula (7) may be any of an E-form double bond and a Z-form double bond.

In formula (9), $R^{20}$ and $R^{21}$ each independently represents a cyano group or an acidic group, and $R^{20}$ and $R^{21}$ may be identical with or different from each other. Specific preferred examples of the acidic group include a carboxy group, a sulfo group, and a phosphate group. A more preferred example of the acidic group is a carboxy group. The carbon-carbon double bond In formula (9) may be any of an E-form double bond and a Z-form double bond.

The group represented by formula (7) is preferably a group represented by formula (10) or formula (11).

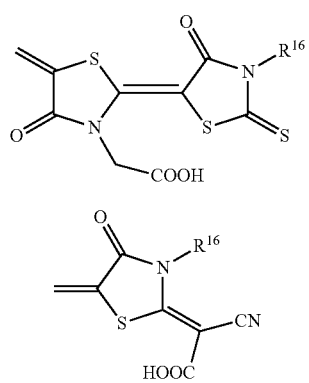

Formula (10)

Formula (11)

In formulae (10) and (11), $R^{16}$ have the same meaning as that in formula (7), and a preferable range is also the same.

Specific examples of the dye (dye compound) used in the present invention are shown in the followings, but the present invention is not limited thereto.

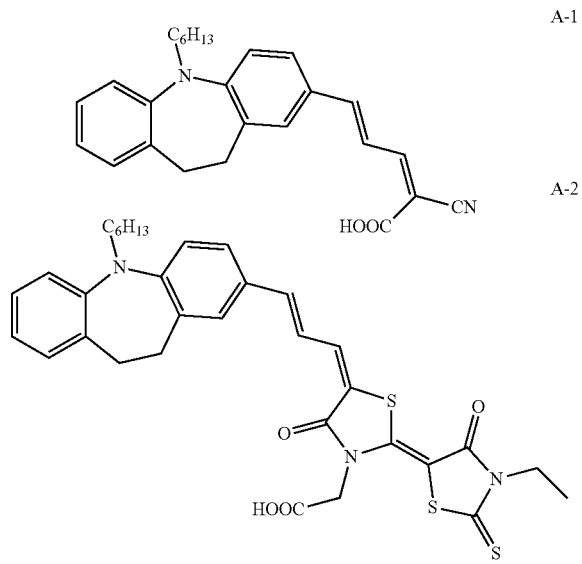

A-1

A-2

-continued
A-3
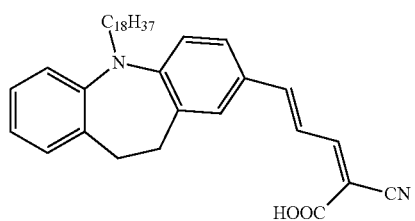
A-4
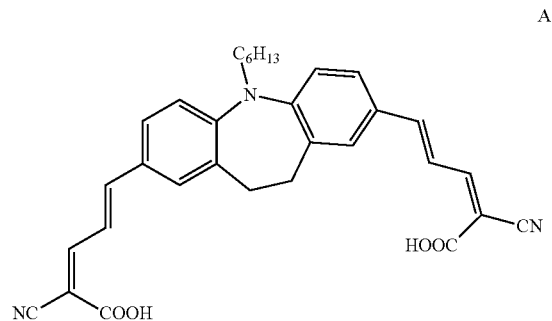
A-5
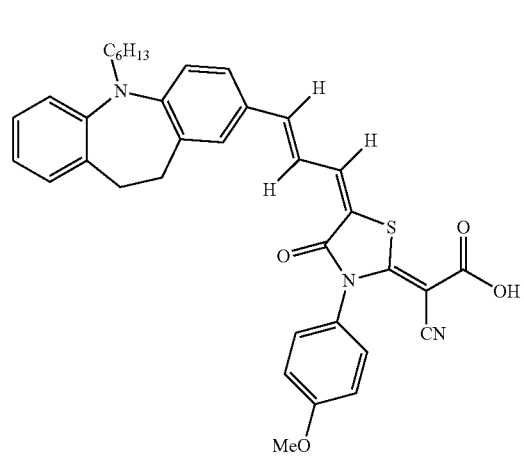
A-6
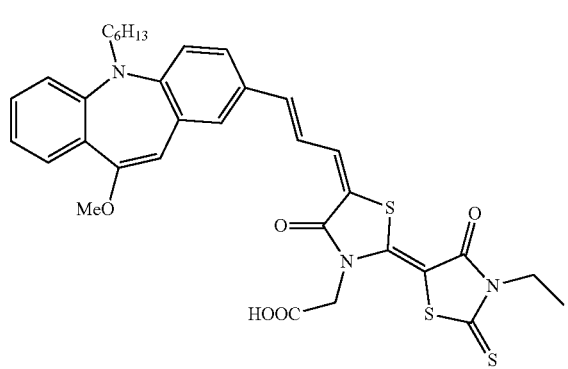

-continued
A-7
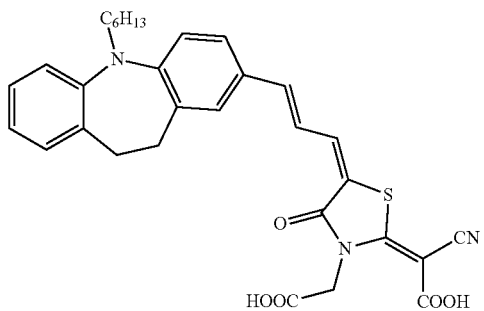
A-8
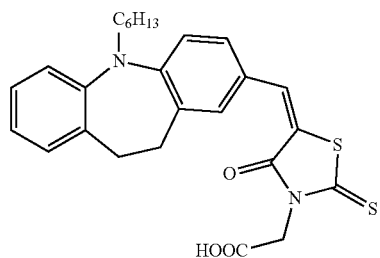
A-9
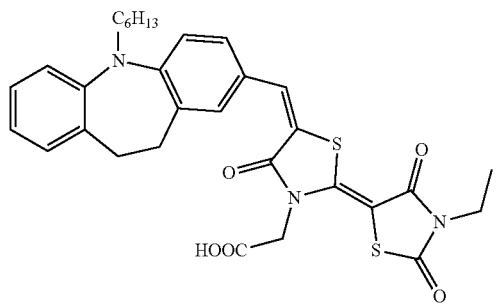
A-10
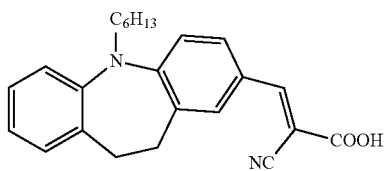
A-11
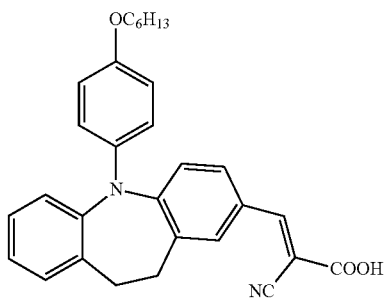
A-12
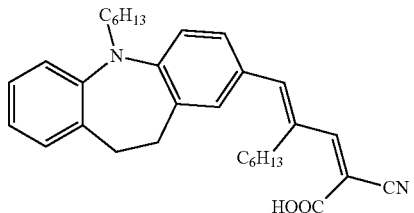

A-13
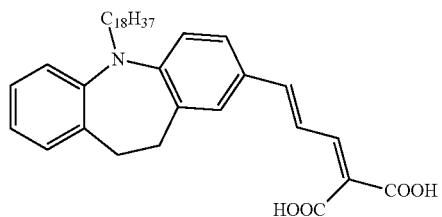
A-14
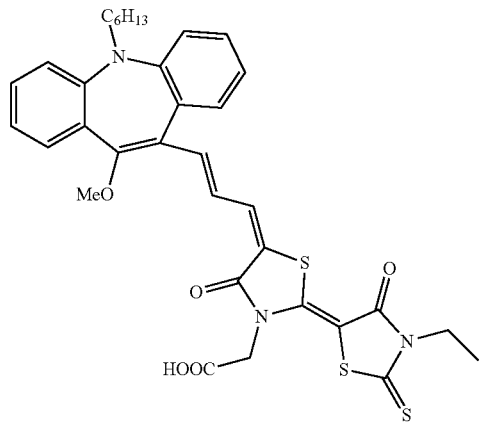
A-15
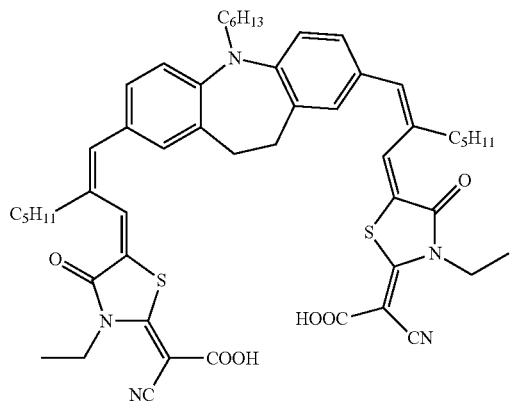
A-16
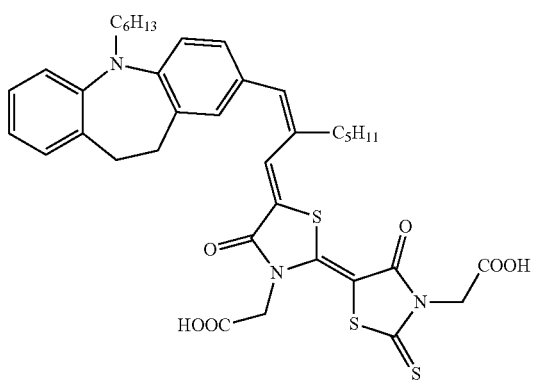

A-17
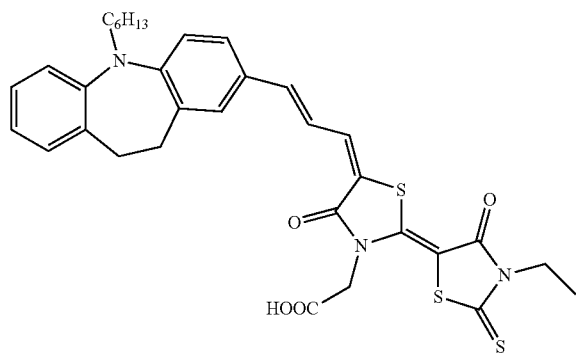
A-18
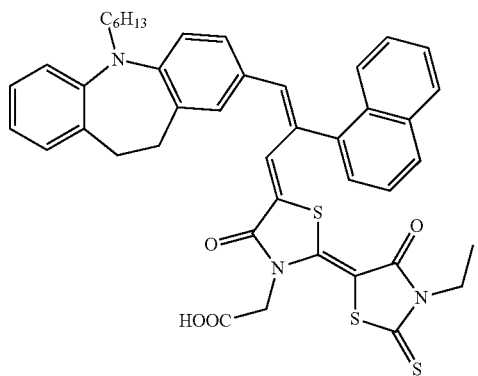
A-19
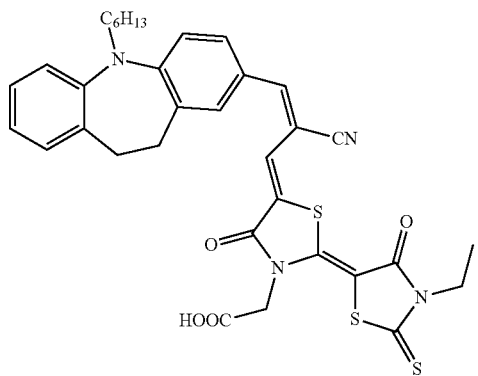
A-20
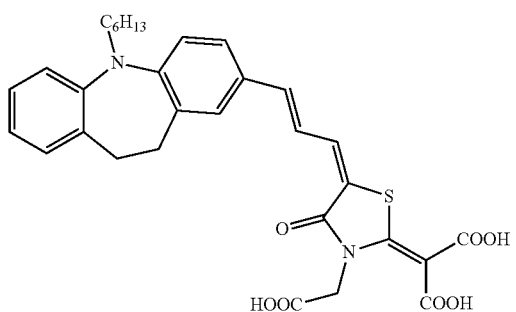

-continued

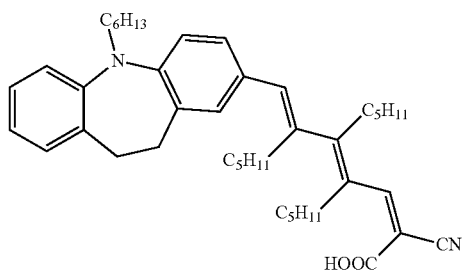
A-21

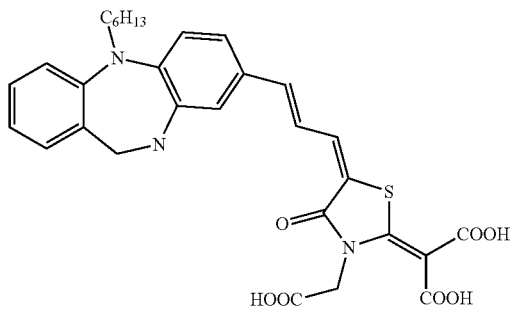
A-22

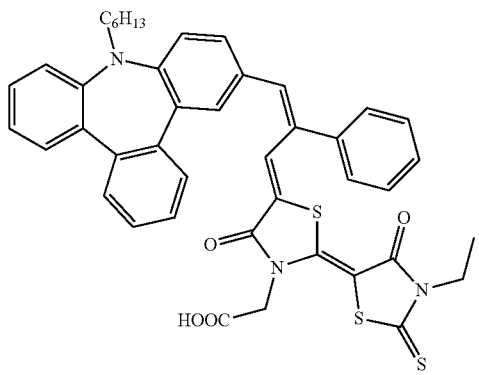
A-23

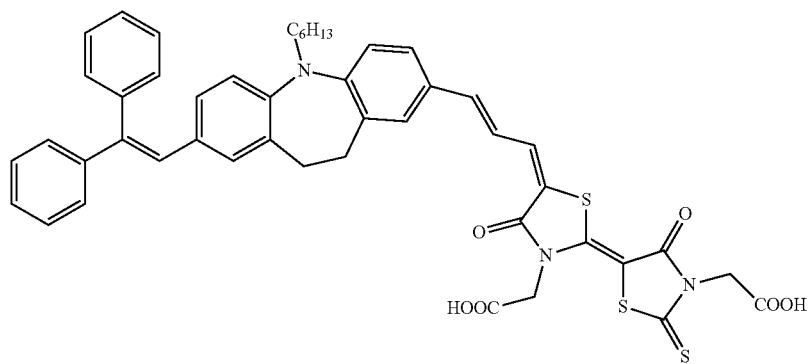
A-24

The dye (dye compound) used in the present invention can be synthesized by, for example, methods described or cited in F. M. Harmer, "Heterocyclic Compounds—Cyanine Dyes and Related Compounds", John Wiley & Sons, New York and London, 1994, or methods similar thereto.

In order to adsorb a dye to semiconductor fine particles, it is preferable to immerse semiconductor fine particles that have been thoroughly dried, in a dye solution for dye adsorption formed from a solvent and the dye for use in the present invention. In regard to the solvent that is used in the dye solution for dye adsorption, any solvent capable of dissolving the dye for use in the present invention can be used without any particular limitation. For example, ethanol methanol, isopropanol, toluene, t-butanol, acetonitrile, acetone or n-butanol can be used. Among them, ethanol and toluene can be preferably used.

The dye solution for dye adsorption formed from a solvent and the dye for use in the present invention may be heated if necessary, at 50° C. to 100° C. Adsorption of the dye may be carried out before or after the process of applying the semiconductor fine particles. Adsorption of the dye may also be conducted by simultaneously applying the semiconductor fine particles and the dye. Any unadsorbed dye is removed by washing. In the case of performing calcination of the coating film, it is preferable to carry out the adsorption of the dye after calcination. After calcination has been performed, it is particularly preferable to perform the adsorption of the dye rapidly before water adsorbs to the surface of the coating film. The dye to be adsorbed may be composed of a single kind, or a mixture of plural kinds of dyes may also be used. In the case of using a mixture, two or more kinds of the dye for use in the present invention may be mixed, or the dye for use in the present invention may be mixed with a complex dye described in U.S. Pat. Nos. 4,927,721, 4,684,537, 5,084,365, 5,350,644, 5,463,057, 5,525,440, and JP-A-7-249790. The dyes are selected so that the wavelength region for photoelectric conversion can be made as broad as possible when the dyes are mixed. In the case of using a mixture of dyes, it is required to prepare a dye solution for dye adsorption by dissolving all of the dyes used therein.

The overall amount of use of the dye is preferably 0.01 to 100 millimoles, more preferably 0.1 to 50 millimoles, and particularly preferably 0.1 to 10 millimoles, per square meter of the support. In this case, the amount of use of the dye for use in the present invention is preferably adjusted to 5% by mole or more.

The amount of the dye adsorbed to the semiconductor fine particles is preferably 0.001 to 1 millimole, and more preferably 0.1 to 0.5 millimoles, based on 1 g of the semiconductor fine particles.

When the amount of the dye is adjusted to such a range, the sensitization effect for the semiconductor can be sufficiently obtained. On the other hand, if the amount of the dye is too smaller, the sensitization effect is insufficient, and if the amount of the dye is excessive, the portion of the dye that is not attached to the semiconductor is suspended, and causes a decrease in the sensitization effect.

For the purpose of reducing the interaction between dye molecules such as association, a colorless compound may be co-adsorbed. Examples of the hydrophobic compound that is co-adsorbed include steroid compounds having a carboxyl group (for example, cholic acid and pivaloyl acid).

After the dye has been adsorbed, the surface of the semiconductor fine particles may be treated using amines. Preferred examples of the amines include 4-tert-butylpyridine, and polyvinylpyridine. These may be used directly when the compounds are liquids, or may be used in a state of being dissolved in an organic solvent.

Hereinafter, the charge transfer layer and the counter electrode will be explained in detail.

The charge transfer layer is a layer having a function of supplementing electrons to an oxidant of the dye, and is provided between the light-receiving electrode and the counter electrode. Representative examples of the material forming the charge transfer layer include a liquid prepared by dissolving a redox pair in an organic solvent, a so-called gel electrolyte obtained by impregnating a polymer matrix with a liquid prepared by dissolving a redox pair in an organic solvent, and a molten salt containing a redox pair.

Examples of the redox pair include a combination of iodine and an iodide (for example, lithium iodide, tetrabutylammonium iodide, or tetrapropylammonium iodide), a combination of an alkylviologen (for example, methylviologen chloride, hexylviologen bromide, or benzylviologen tetrafluoroborate) and a reductant thereof, a combination of a polyhydroxybenzene (for example, hydroquinone or naphthohydroquinone) and an oxidant thereof, and a combination of a divalent iron complex and a trivalent iron complex (for example, potassium ferricyanide and potassium ferrocyanide). Among these, a combination of iodine and an iodide is preferred.

Examples of the organic solvent that dissolves these materials include aprotic polar solvents (for example, acetonitrile, propylene carbonate, ethylene carbonate, dimethylformamide, dimethylsulfoxide, sulfolane, 1,3-dimethylimidazolinone, and 3-methyloxazolidinone); the water-containing electrolyte liquid described in JP-A-2002-110262; and the electrolyte solvents described in JP-A-2000-36332, JP-A-2000-243134 and WO 00/54361. Among these, preferred organic solvents are acetonitrile, methoxypropionitrile, propylene carbonate and γ-butyrolactone.

Examples of the additives that are added to the electrolyte include 4-tert-butylpyridine mentioned above, as well as the pyridine and pyridine-based compounds described in JP-A-2003-331986; the aminopyridine-based compounds described in JP-A-2004-47229, JP-A-2004-171821 and the like; the benzimidazole-based compounds described in JP-A-2004-273272; the aminotriazole-based compounds and aminothiazole-based compounds described in JP-A-2005-38711; the imidazole-based compounds described in JP-A-2005-108663; quinoline-based compounds (see, for example, JP-A-2005-135782); aminotriazine-based compounds (see, for example, JP-A-2005-183166); urea derivatives (see, for example, JP-A-2003-168493); amide compounds (see, for example, JP-A-2004-103404); pyrimidine-based compounds (see, for example, JP-A-2004-247158); and heterocycles that do not contain nitrogen (see, for example, JP-A-2005-166612, JP-A-2005-166613 and JP-A-2005-16615).

It is also preferable to employ a method of controlling the water content of the electrolyte liquid, in order to enhance the efficiency. Preferred examples of the method of controlling the water content include a method of controlling the concentration (see, for example, JP-A-2000-323189 and JP-A-2001-76774), and a method of adding a dehydrating agent (see, for example, JP-A-2002-237335).

In order to reduce the toxicity of iodine, a clathrate compound of iodine with cyclodextrin may be used as described in JP-A-2004-235011. Alternatively, a method of supplying moisture on a steady basis may be used as described in JP-A-2003-25709. Furthermore, a cyclic amidine may be used as described in Japanese Patent No. 3462115; or an oxidation inhibitor (see, for example, JP-A-2004-39292), a hydrolysis inhibitor (see, for example, JP-A-2004-111276), a decomposition inhibitor (see, for example, JP-A-2004-111277) or zinc iodide (see, for example, JP-A-2004-152613) may be added.

A molten salt may also be used as the electrolyte, and preferred examples of the molten salt include an ionic liquid containing an imidazolium or triazolium type cation (see, for example, JP-T-9-507334, JP-A-8-259543, JP-A-2003-31270, JP-A-2005-112733, JP-A-2005-116367, JP-A-2005-112733, JP-A-2003-68374, JP-A-2003-92153, JP-A-2004-241378, JP-A-2005-85587 and JP-A-2004-87387); an oxazolium-based salt (see, for example, JP-A-2000-53662); a pyridinium-based salt (see, for example, JP-A-2000-58891, JP-A-2001-23705, JP-A-2001-167630, JP-A-2001-256828, and JP-A-2001-266962); a guanidium-based salt (see, for example, JP-A-2001-35253); and combinations of these (see, for example, JP-A-2000-90991 and JP-A-2001-35552). These cations may be used in combination with particular anions, and examples of the anions are those described in JP-A-2002-75442, JP-A-2001-75443, JP-A-2002-170426, JP-A-2002-298913, JP-A-2002-367426, JP-A-2003-17148 and the like. Additives may be added these molten salts, and preferred examples of the additives include those described in JP-A-2001-67931, JP-A-2001-160427, JP-A-2002-289267, JP-A-2002-289268, JP-A-2000-90991, JP-A-2000-100485, JP-A-2001-283943, and the like. As described in JP-A-2002-319314 or JP-A-2002-343440, the molten salt may have a substituent having liquid crystalline properties. Furthermore, the quaternary ammonium salt-based molten salt described in JP-A-2005-104845, JP-A-2005-104846, JP-A-2005-179254 and the like may also be used.

Molten salts other than those described above include, for example, the molten salts described in JP-A-2005-139100 and JP-A-2005-145927, as well as a molten salt to which fluidity at room temperature has been imparted by mixing lithium iodide and at least one kind of other lithium salt (for example, lithium acetate or lithium perchlorate) with polyethylene oxide. The amount of addition of the polymer in this case is 1 to 50% by mass. Furthermore, the electrolyte liquid may contain γ-butyrolactone, and this γ-butyrolactone increases the diffusion efficiency of iodide ions, and thereby, the conversion efficiency is enhanced.

The electrolyte may be quasi-solidified by adding a gelling agent to an electrolyte liquid formed from an electrolyte and a solvent, and gelling the electrolyte liquid thereby. Examples of the gelling agent include an organic compound having a molecular weight of 1000 or less (see, for example, JP-A-11-185836, JP-A-2000-36608 and JP-A-2000-58140); an Si-containing compound having a molecular weight in the range of 500 to 5000 (see, for example, JP-A-2003-203520); an organic salt obtained from a particular acidic compound and a particular basic compound (see, for example, JP-A-2003-203520); a sorbitol derivative (see, for example, JP-A-2003-346928); and polyvinylpyridine (see, for example, JP-A-2004-227920 and JP-A-2005-93370).

Furthermore, a method of confining a matrix polymer, a crosslinked type polymer compound or monomer, a crosslinking agent, an electrolyte and a solvent, in a polymer may be used.

Preferred examples of the matrix polymer include a polymer having a nitrogen-containing heterocyclic ring in a repeating unit in the main chain or in a side chain, and a crosslinked structure formed by reacting the polymer with an electrophilic compound (see, for example, JP-A-11-12691 and JP-A-2000-86724); a polymer having a triazine structure and a polymer having a ureide structure (see, for example, JP-A-2000-251532); a polymer containing a liquid crystalline compound (see, for example, JP-A-2000-319260 and JP-A-2002-246066), a polymer having an ether bond (see, for example, JP-A-2000-150006, JP-A-2002-63813, JP-A-2001-338700, and JP-A-2002-75480); a polyvinylidene fluoride-based polymer (see, for example, JP-A-2003-303628); a methacrylate/acrylate-based polymer (see, for example, JP-A-2001-28276 and JP-A-2001-210390); a thermosetting resin (see, for example, JP-A-2002-363414 and JP-A-2002-305041); crosslinked polysiloxane (see, for example, JP-A-2002-216861); polyvinyl alcohol (PVA) (see, for example, JP-A-2002-175841); a clathrate compound of polyalkylene glycol and dextrin (see, for example, JP-A-2004-327271); a system incorporated with an oxygen-containing or sulfur-containing polymer (see, for example, JP-A-2005-108845); and a naturally occurring polymer (see, for example, JP-A-2005-71688). An alkali-swellable polymer (see, for example, JP-A-2002-175482), a polymer having a component capable of forming a charge transfer complex with a cation moiety and iodine within one polymer molecule (see, for example, JP-A-2005-63791), or the like may be added to those matrix polymers.

A system containing, as a matrix polymer, a crosslinked polymer formed by reacting a bifunctional or higher-functional isocyanate as one component with a functional group such as a hydroxyl group, an amino group or a carboxyl group, may also be used. Examples of this system are described in JP-A-2000-228234, JP-A-2002-184478, JP-A-2002-289271 and JP-A-2003-303630. Furthermore, a crosslinked polymer based on a hydrosilyl group and a double-bonded compound (see, for example, JP-A-2003-59548), a crosslinking method involving reacting polysulfonic acid, polycarboxylic acid or the like with a divalent or higher-valent metal ion compound (see, for example, JP-A-2003-86258), and the like may also be used.

Examples of the solvent that can be used with preference in combination with the quasi-solid electrolyte described above, include particular phosphates (see, for example, JP-A-2000-100486 and JP-A-2003-16833); a mixed solvent containing ethylene carbonate (see, for example, JP-A-2004-87202); a solvent having a particular relative permittivity (see, for example, JP-A-2004-335366); and the solvents described in JP-A-2003-16833 and JP-A-2003-264011.

A liquid electrolyte solution may be retained in a solid electrolyte membrane or in pores, and preferred examples of the method include the usage of an electrically conductive polymer membrane (JP-A-11-339866), a fibrous solid (JP-A-2000-357544), and a fabric-like solid such as filter (JP-A-2001-345125). It is also acceptable to use the particular combination of a gel electrolyte and an electroconductive resin counter electrode described in JP-A-2003-157914.

A solid charge transport system such as a p-type semiconductor or a hole transporting material may also be used instead of the liquid electrolytes and quasi-solid electrolytes described above. Preferred examples of the p-type semiconductor include CuI (see, for example, JP-A-2001-156314, JP-A-2001-185743, JP-A-2001-185743, JP-A-2001-230434, JP-A-2003-273381, JP-A-2003-234485, JP-A-2003-243681, and JP-A-2003-234486), CuSCN and p-SbAl (see, for example, JP-A-2003-258284). Preferred examples of the producing method of the hole transporting material include those described in, for example, JP-A-2003-331938, JP-A-2001-168359, JP-A-2001-196612, JP-A-2001-257370, JP-A-2002-246623, JP-A-2002-246624, and JP-A-2003-289151.

A photoelectrochemical cell having high conversion efficiency can be obtained by using a laminate in which a hole transporter is provided adjacent to a photosensitive layer of the semiconductor fine particles having the dye used in the present invention adsorbed thereto. The hole transporter is not particularly limited, but an organic hole transporting material can be used. Preferred examples of the hole transporter include electrically conductive polymers such as polythiophene (see, for example, JP-A-2000-106223 and JP-A-2003-364304), polyaniline (see, for example, JP-A-2003-264304), polypyrrole (see, for example, JP-A-2000-106224 and JP-A-2003-264304), and polysilane (see, for example, JP-A-2001-53555 and JP-A-2001-203377); a spiro compound in which two rings share a central element adopting a tetrahedral structure, such as C and Si (see, for example, JP-T-11-513522 and JP-T-2001-525108); aromatic amine derivatives such as triarylamine (see, for example, JP-A-11-144773, JP-A-11-339868, JP-A-2003-123856, JP-A-2003-197942 and JP-A-2004-356281); triphenylene derivatives (see, for example, JP-A-11-176489); nitrogen-containing heterocycle derivatives (see, for example, JP-A-2001-85077 and JP-A-2001-85713); and liquid crystalline cyano derivatives (see, for example, Japanese Patent No. 3505381).

The redox pair serves as a carrier for electrons, and thus is required at a certain concentration. A preferred overall concentration is 0.01 moles/liter or more, more preferably 0.1 moles/liter or more, and particularly preferably 0.3 moles/ liter or more. In this case, the upper limit of the concentration is not particularly limited, but is usually about 5 moles/liter.

The counter electrode is an electrode working as a positive electrode in the photoelectrochemical cell. The counter electrode usually has the same meaning as the electrically conductive support described above, but in a construction which is likely to maintain a sufficient strength, a support is not necessarily required. However, a construction having a support is advantageous in terms of sealability. Examples of the material for the counter electrode include platinum, carbon, and electrically conductive polymers. Preferred examples include platinum (see, for example, JP-A-2001-102102), carbon (see, for example, JP-A-2002-298936, JP-A-2003-297446, JP-A-2004-127849, JP-A-2004-152747, JP-A-2004-165015, JP-A-2004-111216, JP-A-2004-241228, and JP-A-2004-319872), and electrically conductive polymers (see, for example, JP-A-2003-317814, JP-A-2004-319131, and JP-A-2005-116301). Materials described in JP-A-2001-43908, JP-A-2003-142168, JP-A-2004-127849 and JP-A-2004-152747 may also be used.

A preferred structure of the counter electrode is a structure having a high charge collecting effect. Preferred examples thereof include those described in, for example, JP-A-10-505192, JP-A-2004-296669, JP-A-2005-11609, JP-A-2005-141996, JP-A-2005-142090, JP-A-2005-158470, JP-A-2000-348784, JP-A-2005-158379, JP-A-2000-294305, JP-A-2001-243995, JP-A-2004-241228, JP-A-2004-296203, JP-A-2004-319872, and JP-A-2005-197097.

In regard to the light-receiving electrode, a composite electrode of titanium oxide and tin oxide ($TiO_2/SnO_2$) or the like may be used. Examples of mixed electrodes of titania include those described in JP-A-2000-113913, JP-A-2004-95387, JP-A-2001-155791, JP-A-2003-272723, JP-A-05-504023, JP-A-2000-114563, JP-A-2002-75476, JP-A-2002-8741, CN 1350334(A), JP-A-2003-272724, JP-A-2003-308891, JP-A-2005-174934, JP-A-2001-358348, JP-A-2003-123862, JP-A-2004-103420, JP-A-2005-39013 and JP-A-2003-317815. Examples of mixed electrodes of materials other than titania include those described in JP-A-2001-185243, JP-A-2003-282164, JP-A-2003-289151, JP-A-2003-321299, JP-A-2002-93471, JP-A-2002-141115, JP-A-2002-184476, JP-A-2002-356400, JP-A-2002-246623, JP-A-2002-246624, JP-A-2002-261303, JP-A-2003-243053, JP-A-2004-6235, JP-A-2003-323920, JP-A-2004-277197, JP-A-2004-210605, JP-A-2005-135798, JP-A-2005-135799, JP-A-2001-196105, JP-A-2002-100418, JP-A-2002-100419, JP-A-2002-280084, JP-A-2003-272724, JP-A-2004-124124, JP-A-9-237641, JP-A-11-273755, and JP-A-2004-247105.

The light-receiving electrode may be a tandem type electrode so as to increase the utility ratio of the incident light, or the like. Preferred examples of the tandem type construction include those described in JP-A-2002-90989, JP-A-2002-222971, JP-A-2003-168496, JP-A-2003-249275, JP-A-2005-166313, JP-A-11-273753, JP-A-2002-167808, JP-A-2005-129259, JP-A-2002-231324, JP-A-2005-158620, JP-A-2005-158621, JP-A-2005-191137 and JP-A-2003-333757.

The light-receiving electrode may be provided with the photo management function by which light scattering and reflection are efficiently achieved inside the light-receiving electrode layer. Preferred examples thereof include those described in, for example, JP-A-2002-93476, JP-A-2004-296373, JP-A-2002-352868, JP-A-2003-142170, JP-A-2003-59549, JP-A-2002-289274, JP-A-2002-222968, JP-A-2003-217688, JP-A-2004-172110, JP-A-2003-303629, JP-A-2004-343071, JP-A-2005-116302, JP-A-09-259943, JP-A-10-255863, JP-A-2003-142171, JP-A-2002-110261, and JP-A-2004-311197.

It is preferable to form a short circuit preventing layer between the electrically conductive support and the porous semiconductor fine particle layer, so as to prevent reverse current due to a direct contact between the electrolyte liquid and the electrode. Preferred examples thereof include those described in, for example, JP-T-6-507999, JP-A-06-51113, JP-A-2000-178792, JP-A-11-312541, JP-A-2000-285974, JP-A-2000-285979, JP-A-2001-143771, JP-A-2001156314, JP-A-2001-307785, JP-A-2002-151168, JP-A-2002-75471, JP-A-2003-163359, JP-A-2003-163360, JP-A-2003-123856, WO 03/038909, JP-A-2002-289270, JP-A-2002-319439, JP-A-2003-297443, JP-A-2004-87622, JP-A-2003-331934, JP-A-2003-243054, JP-A-2004-319130, JP-A-2004-363069, JP-A-2005-71956, JP-A-2005-108807, JP-A-2005-108836, and JP-A-2005-142087.

It is preferable to employ a spacer or a separator so as to prevent the contact between the light-receiving electrode and the counter electrode. Preferred examples thereof include those described in, for example, JP-A-2001-283941, JP-A-2003-187883, JP-A-2000-294306, JP-A-2002-175844, JP-A-2002-367686, and JP-A-2004-253333.

According to the present invention, a photoelectric conversion element having high conversion efficiency and a photoelectrochemical cell can be produced at low cost.

EXAMPLES

The present invention will be described in more detail based on the following examples, but the invention is not intended to be limited thereto.

Synthesis Examples

1. Preparation of Exemplified Dye A-1

The exemplified dye A-1 was prepared according to the method shown in the following scheme.

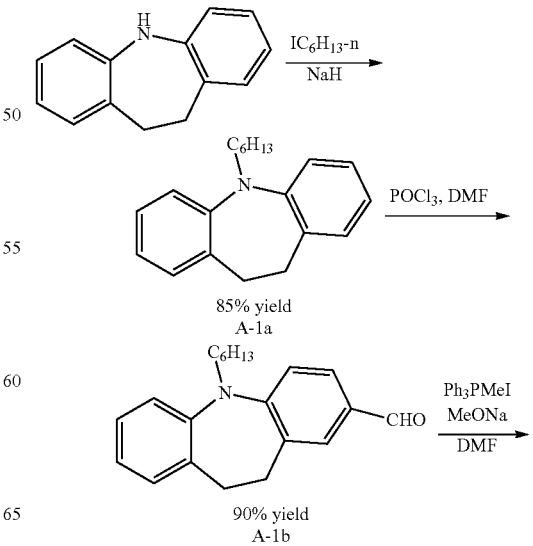

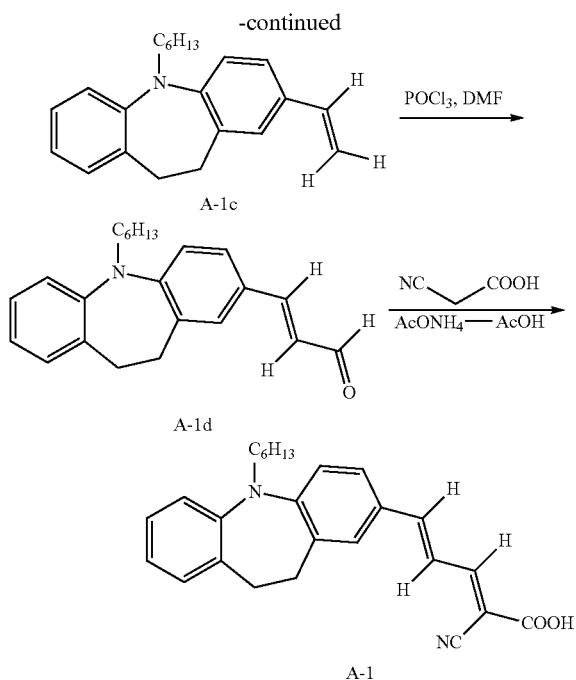

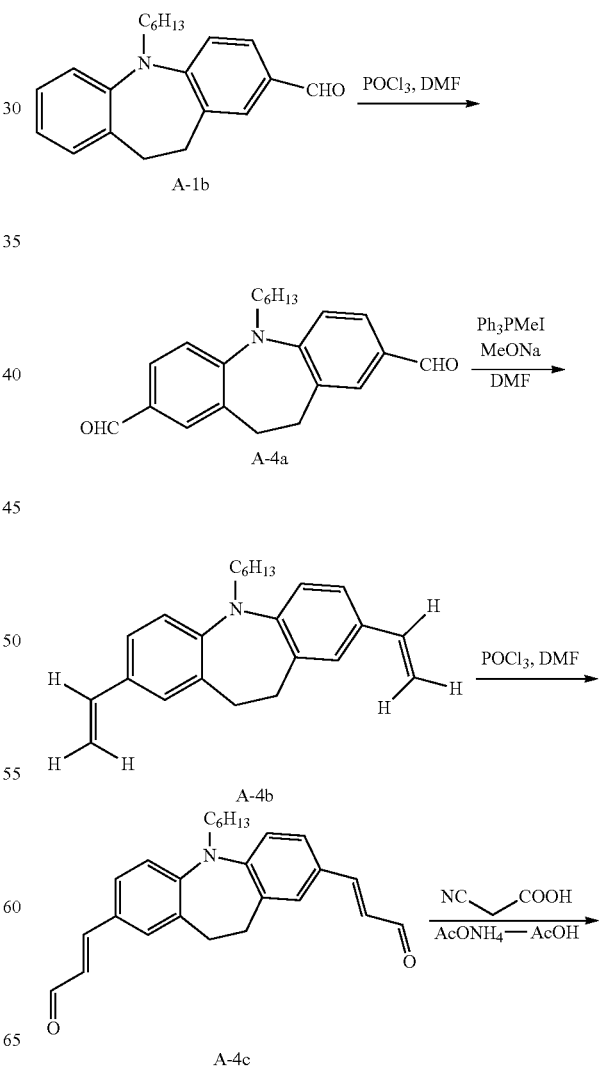

the resulting mixture was heated to 60° C. and stirred for 3 hours. The mixture was left to cool to room temperature, subsequently water was added to the reaction liquid, and the mixture was stirred. Further, a 10% aqueous solution of sodium hydroxide was added to the mixture, and the resulting mixture was stirred for one hour. The mixture was subjected to extraction with ethyl acetate, concentration and column purification, and thus 2.0 g of Compound A-1d was obtained.

(5) Synthesis of Exemplified Dye A-1

Were added 1.0 g of Compound A-1d and 0.25 g of cyanoacetic acid to 20 mL of AcOH, and the mixture was stirred for 30 minutes. Subsequently, 0.5 g of ammonium acetate was added thereto, and the mixture was heated to 90° C. and stirred for 3 hours. The reaction liquid was left to cool to room temperature, and then water was added to the reaction liquid. The mixture was subjected to extraction with ethyl acetate and concentration. Crystals thus obtained were purified by recrystallization, and thus 0.6 g of the exemplified dye A-1 was obtained.

2. Preparation of Exemplified Dye A-4

(1) Preparation of Compound A-1a

Were dissolved 15.0 g of 10,11-dihydro-5H-dibenz[b,f]azepine and 21.0 g of 1-iodohexane in 60 mL of DMF under stirring at room temperature, and then the solution was cooled with ice. Thereto, 7.5 g of 50% to 70% sodium hydride was added in divided portions, and the mixture was stirred for 1.5 hours at an internal temperature of 10° C. or lower. After completion of the reaction, water was added dropwise to the reaction liquid to deactivate remaining sodium hydride, and hexane was added to perform partition. The organic layer was concentrated and purified by column chromatography, and thus 18.3 g of Compound A-1a was obtained.

(2) Preparation of Compound A-1b

Was added 20 mL of phosphorus oxychloride to 60 mL of DMF under ice cooling, and the mixture was stirred for 30 minutes. Thereto, 9.5 g of Compound A-1a was added, and the resulting mixture was heated to 60° C. and stirred for 3 hours. The mixture was left to cool to room temperature, subsequently water was added to the reaction liquid, and the mixture was stirred. Further, a 10% aqueous solution of sodium hydroxide was added to the mixture, and the resulting mixture was stirred for one hour. The mixture was subjected to extraction with ethyl acetate, concentration and column purification, and thus 9.4 g of Compound A-1b was obtained.

(3) Preparation of Compound A-1c

Were dissolved 2.0 g of Compound A-1b and 3.2 g of triphenylmethyl iodide in 20 mL of DMF under stirring at room temperature, and then 1.5 g of a 28% MeOH solution of sodium methoxide was added dropwise thereto. Subsequently, the mixture was heated to 60° C. and stirred for 2 hours. The reaction liquid was left to cool to room temperature, and then water was added to the reaction liquid. Hexane was further added to the mixture, and then partition was performed. The organic layer was concentrated and then purified by column chromatography, and thus 1.9 g of Compound A-1c was obtained.

(4) Preparation of Compound A-1d

Was added 5 mL of phosphorus oxychloride to 10 mL of DMF under ice cooling, and the mixture was stirred for 30 minutes. Thereto, 1.9 g of Compound A-1c was added, and -continued

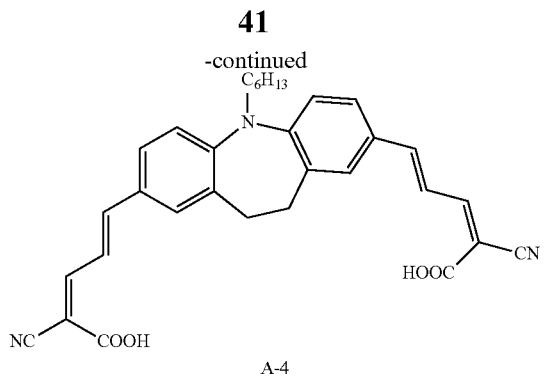

A-4

(1) Preparation of Compound A-4-a

Was added 15 mL of phosphorus oxychloride to 30 mL of DMF under ice cooling, and the mixture was stirred for 30 minutes. Was added 5.8 g of Compound A-1b to this mixture, and the resulting mixture was heated to 60° C. and stirred for 4 hours. The reaction liquid was left to cool to room temperature, subsequently water was added thereto, and the mixture was stirred. The reaction liquid was added dropwise to a 10% aqueous solution of sodium hydroxide under ice cooling, and the mixture was stirred for one hour. The reaction liquid was subjected to extraction with ethyl acetate, concentration and column purification, and thus 3.3 g of Compound A-4-a was obtained.

(2) Preparation of Compound A-4-b

Were dissolved 1.7 g of Compound A-4a and 4.9 g of triphenylmethyl iodide in 20 mL of DMF under stirring at room temperature, and then 2.3 g of a 28% MeOH solution of sodium methoxide was added dropwise thereto. Subsequently, the mixture was heated to 60° C. and stirred for 2 hours. The reaction liquid was left to cool to room temperature, and then water was added to the reaction liquid. Hexane was further added to the mixture, and then partition was performed. The organic layer was concentrated and then purified by column chromatography, and thus 1.4 g of Compound A-4-b was obtained.

(3) Preparation of Compound A-4-c

Was added 10 mL of phosphorus oxychloride to 20 mL of DMF under ice cooling, and the mixture was stirred for 30 minutes. Was added 1.3 g of Compound A-4-b to this mixture, and the resulting mixture was heated to 60° C. and stirred for 2 hours. The reaction liquid was left to cool to room temperature, subsequently water was added thereto, and the mixture was stirred. The reaction liquid was added dropwise to a 10% aqueous solution of sodium hydroxide under ice cooling, and the mixture was stirred for one hour. The reaction liquid was subjected to extraction with ethyl acetate, concentration and column purification, and thus 1.5 g of Compound A-4-c was obtained.

(4) Synthesis of Exemplified Dye A-4

Were added 1.4 g of Compound A-4-c and 0.6 g of cyanoacetic acid were added to 20 ml of AcOH, and the mixture was stirred for 30 minutes. Subsequently, 1.1 g of ammonium acetate was added thereto, and the mixture was heated to 90° C. and stirred for 4 hours. The reaction liquid was left to cool to room temperature, and then water was added to the reaction liquid. The mixture was subjected to extraction with ethyl acetate and concentration. Crystals thus obtained were purified by recrystallization, and thus 1.5 g of the Exemplified Dye A-4 was obtained.

3. Preparation of Exemplified Dye A-5

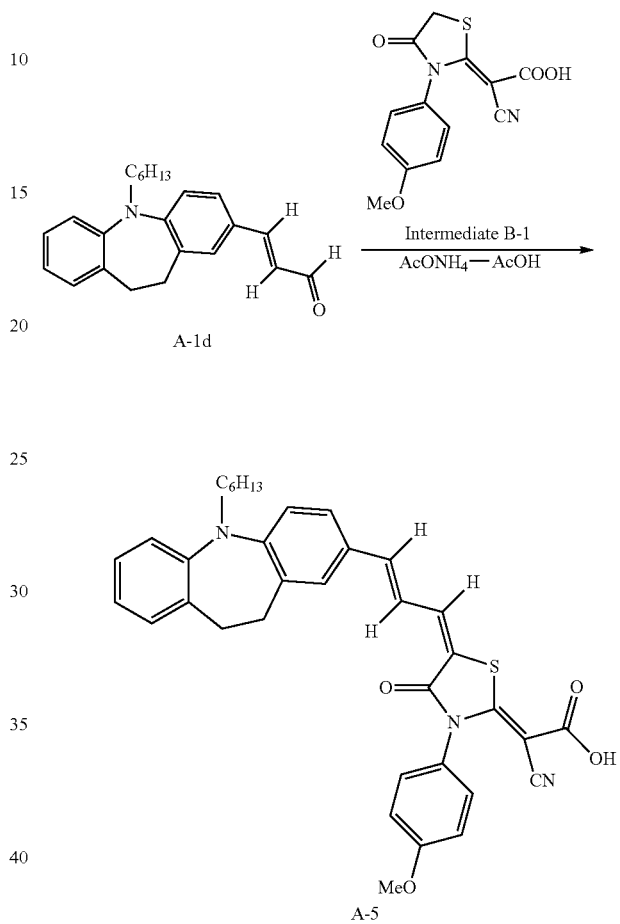

A-5

(1) Preparation of Intermediate B-1

Were added 2.6 g of t-butyl cyanoacetate and 3.0 g of 4-methoxyphenyl isothiocyanate to 20 mL of DMF, and the mixture was stirred in an ice bath. Subsequently, 3.1 g of DBU was added dropwise thereto. The mixture was stirred for 2 hours, and then 3.0 g of ethyl bromoacetate was added thereto. The mixture was heated to 80° C. and was stirred for 4 hours. Subsequently, the mixture was left to cool to room temperature. Water was added thereto, and the reaction liquid was subjected to partition with ethyl acetate, concentration, and column purification, and thus 0.4 g of Intermediate B-1 was obtained.

(2) Synthesis of Exemplified Dye A-5

Were added 1.7 g of Compound A-1d and 1.5 g of Intermediate B-1 to 20 mL of AcOH, and the mixture was stirred for 30 minutes. Subsequently, 0.7 g of ammonium acetate was added thereto, and the mixture was heated to 90° C. and stirred for 4 hours. The reaction liquid was left to cool to room temperature, and then water was added to the reaction liquid.

The mixture was subjected to extraction with ethyl acetate and concentration. Crystals thus obtained were purified by recrystallization, and thus 1.5 g of Exemplified Dye A-4 was obtained.

4. Preparation of Exemplified Dye A-8

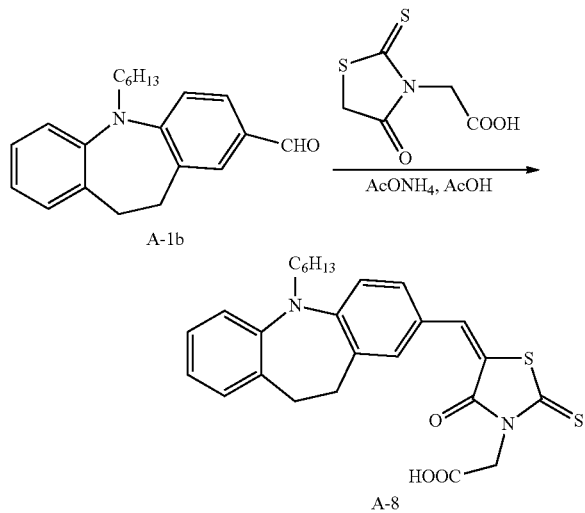

Were dissolved 1.0 g of Compound A-1b and 0.6 g of 3-carboxymethylrhodanine in 20 mL of acetic acid under stirring at room temperature. Was added 0.5 g of ammonium acetate to this solution, and the mixture was heated to 90° C. and stirred for 4 hours. After the mixture was cooled, water was added thereto, and precipitated crystals were collected by filtration and were recrystallized from a MeOH/CH$_2$Cl$_2$ system. Thus, 1.0 g of Exemplified Dye A-8 was obtained.

Exemplified dyes A-2, A-15 and A-20 were synthesized in the same manner as in the exemplified dyes prepared in the above.

The maximum absorption wavelengths of the obtained exemplified dyes A-1, A-2, A-4, A-5, A-8, A-15 and A-20 were measured. The measurement was carried out by dissolving the dyes in ethanol and using a spectrophotometer (trade name: U-4100, manufactured by Hitachi High-Technologies Corp.). The results were 396 nm, 491 nm, 423 nm, 470 nm, 445 nm, 475 nm and 470 nm for the dyes A-1, A-2, A-4, A-5, A-8, A-15 and A-20, respectively.

Example 1

A photoelectrochemical cell was produced according to the method described below, and the cell was evaluated. The results are presented in Table 1.

(1) Production of Transparent Electrically Conductive Support

Fluorine-doped tin dioxide was uniformly applied by a CVD method over the entire surface of an alkali-free glass substrate having a thickness of 1.9 mm, and thus a transparent electrically conductive support coated on one side with a conductive tin dioxide film having a thickness of 600 nm, a surface resistance of about 15 Ω/cm$^2$ and a light transmittance (500 nm) of 85%, was formed.

(2) Preparation of Semiconductor Fine Particles
(i) Semiconductor Fine Particles a A dispersion liquid of anatase type titanium dioxide containing titanium dioxide at a concentration of 11% by mass was synthesized according to the production method described in C. J. Barbe et al., J. Am. Ceramic Soc., Vol. 80, p. 3157, using titanium tetraisopropoxide as a titanium raw material and setting the temperature of the polymerization reaction in an autoclave at 230° C. The size of the primary particles of the obtained titanium dioxide particles was 10 to 30 nm. The obtained dispersion liquid was subjected to an ultracentrifuge to separate the particles, and the aggregates were dried. Subsequently, the aggregates were pulverized in an agate mortar, and thus semiconductor fine particles a were obtained as white powder.

(ii) Semiconductor Fine Particles b

P-25 (trade name) manufactured by Nippon Aerosil Co., Ltd. was used. P-25 is titanium oxide fine particles having a primary particle size of 20 nm, a BET specific surface area of 50 m$^2$/g, and an anatase content ratio of 77%, produced by a method involving calcination in a gas phase.

(iii) Semiconductor Fine Particles c

Anatase type titanium oxide (anatase content ratio of 99%) manufactured by Aldrich Company was used.

(3) Production of Porous Semiconductor Fine Particle Layer

The semiconductor fine particles a, b and c prepared above were each added to 100 cc of a mixed solvent formed from water and acetonitrile at a volume ratio of 4:1, at a concentration of 32 g per 100 cc of the solvent, and the mixtures were uniformly dispersed and mixed using a mixing conditioner of rotation/revolution combination type. As a result, in the case of the semiconductor fine particles a and b, the obtained white semiconductor fine particle dispersion liquids became highly viscous pastes having viscosities of 50 to 150 N·s/m$^2$, and it was found that these pastes had liquid properties adequate to be used directly in the coating. However, in the case of the semiconductor fine particles c, the semiconductor fine particle dispersion liquid had a low viscosity, and a coating film having a constant thickness could not be obtained. There, the dispersion liquids obtained by using the semiconductor fine particles a and b were each applied on the transparent electrically conductive support coated with an electrically conductive tin dioxide film produced above, using an applicator, and the dispersion liquid was dried at room temperature for one hour. Thereby, a coating layer having a uniform thickness of 40 to 70 μm was formed. This coating layer was further dried for 30 minutes at 120° C., and then was exposed to UV light for 30 minutes from a mercury lamp ultraviolet light source of 100 W, followed by a post-treatment. As such, a porous semiconductor fine particle layer for dye sensitization was produced. The final average thickness of the porous semiconductor fine particle layer was 6.5 μm for the substrate a which used the semiconductor fine particles a, and 6.2 μm for the substrate b which used the semiconductor fine particles b.

In order to investigate the weight of the content of solids excluding the semiconductor fine particles contained in the dispersion liquid, the semiconductor fine particle layer was heated in air at 350° C. for 0.5 hours, and the weight change before and after the heating was measured. As a result, the weight decrease per unit area in sample Nos. 1 to 5 and 7 to 10, in which the dispersion liquids did not contain any solids other than the semiconductor fine particle layers a and b, was 0.3 mass % in all cases. In sample Nos. 6 and 11, the experiment was carried out using dispersion liquids respectively containing 7.7 g and 11.7 g of a powder of polyethylene glycol (PEG) having an average molecular weight of 500,000 per 100 cc of a solvent. The solids contents were 8.0 mass % and 12.0 mass %, respectively.

(4) Preparation of Solution for Dye Adsorption

A comparative dye R-1 (dye described in Japanese Patent No. 4148374) described in Table 1 given below was dissolved in a mixed solvent of dry acetonitrile:t-butanol:ethanol at a volume ratio of 2:1:1, to obtain a dye concentration of $3 \times 10^{-4}$ moles/liter. In this dye solution, an organic sulfonic acid derivative having a structure of p-$C_9H_{19}$—$C_6H_4$—O—($CH_2CH_2$—O)$_3$—($CH_2$)$_4$—$SO_3$Na was dissolved as an additive to obtain a concentration of 0.025 moles/liter, and thus a solution for dye adsorption was prepared.

Furthermore, the other dyes described in the Table 1 given below each were dissolved in dry ethanol to obtain a concentration of $3 \times 10^{-4}$ moles/liter, and thus a solution for dye adsorption was obtained.

(5) Adsorption of Dye

The substrates a and b each coated with a porous semiconductor fine particle layer were immersed in the dye solution for adsorption described above, and were left immersed under stirring for 3 hours at 40° C.

The dye was adsorbed to the semiconductor fine particle layers as such, and thus dye-sensitized electrodes to be used in photosensitive layers (photosensitive electrodes) were produced.

(6) Production of Photoelectrochemical Cell

A dye-adsorbed porous semiconductor fine particle layer was subjected to finishing, and thereby a circular photosensitive electrode having a light-receiving area of 1.0 cm$^2$ (diameter about 1.1 cm) was formed. A platinum-deposited glass substrate as a counter electrode was superposed against the photosensitive electrode, with a frame type spacer (thickness 20 μm) produced from a thermally pressed polyethylene film inserted between the electrodes. The spacer areas were heated to 120° C., and the two substrates were pressed. Furthermore, the edge areas of the cell were sealed with an epoxy resin adhesive. A room temperature molten salt having formed from a composition of 1,2-dimethyl-3-propylimidazolium iodide/iodine=50:1 (mass ratio) as an electrolyte liquid was introduced through a small hole for electrolyte liquid injection preliminarily prepared at a corner area of the substrate of the counter electrode, and was infiltrated into the space between the electrodes from the small hole of the substrate, by utilizing the capillary phenomenon. The process of cell construction and the process of electrolyte liquid injection described above were all carried out in dry air having a dew point of −60° C. as described above. After the injection of the molten salt, the cell was suctioned in a vacuum for several hours, and degassing of the inside of the cell containing the photosensitive electrode and the molten salt was performed. Finally, the small hole was sealed with low melting point glass. Thereby, a photoelectrochemical cell in which an electrically conductive support, a porous semiconductor fine particle electrode adsorbed with a dye (photosensitive electrode), an electrolyte liquid, a counter electrode and a support were laminated in this sequence, was produced.

(7) Measurement of Photoelectric Conversion Efficiency

A xenon lamp of 500 W power (manufactured by Ushio, Inc.) was mounted with a correction filter for sunlight simulation (trade name: AM1.5 direct, manufactured by LOT-Oriel AG), and the photoelectrochemical cell was irradiated with a pseudo-sunlight having an incident light intensity of 100 mW/cm$^2$, from the side of the porous semiconductor fine particle electrode (photosensitive electrode). The device was fixed closely on the stage of a thermostat, and the temperature of the device during irradiation was controlled to 50° C. The photocurrent-voltage characteristics were measured by scanning the DC voltage applied to the device using a current voltage analyzer (Source Measure Unit Model 238, manufactured by Keithley Instruments, Inc.) at a constant rate of 10 mV/sec, and thereby measuring the photocurrent outputted by the device. The energy conversion efficiencies (η) of the various devices mentioned above determined thereby are described in Table 1, together with the contents of the constituent elements of the cells (semiconductor fine particles and sensitizing dye).

TABLE 1

| | Condition for producing photoelectrochemical cell | | | | |
|---|---|---|---|---|---|
| Sample No. | Semiconductor fine particles | Dye | Content of solids excluding semiconductor fine particles in dispersion liquid (mass %) | Cell performance Conversion efficiency (%) | Remarks |
| 1 | a | A-1 | 0.3 | 2.2 | This invention |
| 2 | a | A-2 | 0.3 | 2.6 | This invention |
| 3 | a | A-4 | 0.3 | 2.7 | This invention |
| 4 | a | A-15 | 0.3 | 2.6 | This invention |
| 5 | a | A-20 | 0.3 | 2.8 | This invention |
| 6 | a | A-1 | 8.0 | 1.4 | This invention |
| 7 | b | A-2 | 0.3 | 2.4 | This invention |
| 8 | b | A-4 | 0.3 | 2.5 | This invention |
| 9 | b | A-15 | 0.3 | 2.5 | This invention |
| 10 | a | R-1 | 0.3 | 0.9 | Comparative example |
| 11 | a | A-1 | 12.0 | 0.2 | Comparative example |

Comparative Dye R-1 (Compound described in Japanese Patent No. 4148374)

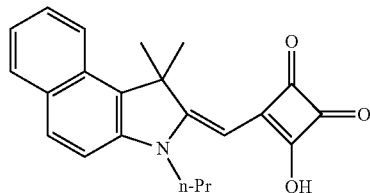

From the results of Table 1, it was found that when a porous semiconductor fine particle layer was produced by applying, on a support, a particle dispersion liquid in which the content of additives was 10 mass % or less of the dispersion liquid, and heating the dispersion liquid coating, and the specific dye was adsorbed thereto, a photoelectrochemical cell having higher conversion efficiency could be obtained (sample Nos. 1 to 9), as compared with the case where a comparative dye was adsorbed. When a dispersion liquid having a content of solids excluding semiconductor fine particles of 0.3 mass % was applied on a support, and the dye for use in the present invention was adsorbed thereto, a photoelectrochemical cell having particularly high conversion efficiency could be obtained (sample Nos. 1 to 5 and 7 to 9).

On the other hand, when a comparative dye was adsorbed to the porous semiconductor fine particles, the conversion efficiency was lowered (sample No. 10). In addition, when a dispersion liquid having a content of solids excluding semiconductor fine particles of more than 10% was applied on a support, the conversion efficiency was extremely lowered, even though and the dye for use in the present invention was adsorbed (sample No. 11).

Example 2

A photoelectrochemical cell was produced according to the method described below, and the cell was evaluated. The results are presented in Table 2.

(1) Production of Transparent Electrically Conductive Support

As a support for photosensitive electrode, a flexible transparent electrically conductive support obtained by uniformly applying a conductive thin film of tin oxide to a thickness of 200 nm, on one surface of a sheet having a thickness of 0.4 mm and having the surfaces coated with fluorine, was used.

(2) Production of Conductive Sheet for Counter Electrode

A platinum film having a thickness of 300 nm was uniformly coated by a vacuum sputtering method, on one surface of a Kapton (registered trademark) film made of polyimide and having a thickness of 0.4 mm. The surface resistance was 5 Ω/cm².

(3) Preparation of Semiconductor Fine Particle Dispersion Liquid

A semiconductor fine particle dispersion liquid was prepared in the same manner as in Example 1, using the semiconductor fine particles a used in Example 1. In the sample Nos. 26 and 31, a powder of polyethylene glycol (PEG) having an average molecular weight of 500,000 was incorporated into the dispersion liquids in amounts of 7.7 g and 11.7 g, respectively, per 100 cc of a solvent. In the other semiconductor fine particle dispersion liquids, no solids other than the semiconductor fine particles were added.

(4) Measurement of Solids in Semiconductor Fine Particle Dispersion Liquid

Each of the dispersion liquids was applied to a thickness of 40 to 70 μm, on an alkali-free glass substrate having a thickness of 1.9 mm, using an applicator, and the dispersion liquid coating was dried for one hour at room temperature. Subsequently, the assembly was heated in air at 350° C. for 0.5 hours, and the weight change before and after the heating was measured. The contents of solids excluding semiconductor fine particles of the sample Nos. 26 and 31 were 8.0 mass % and 12.0 mass %, respectively. The contents of solids excluding semiconductor fine particles in the other samples were all 0.3 mass %.

(5) Preparation of Semiconductor Fine Particle Layer

The dispersion liquid prepared above was applied on the transparent electrically conductive support prepared above, using an applicator, and the dispersion liquid coating was dried one hour at room temperature. Thereby, a uniform coating layer having a thickness of 40 to 70 μm was formed. This coating layer was further treated under the conditions described in Table 2, and thus a porous semiconductor fine particle layer for dye sensitization was produced. The final average thickness of the porous semiconductor fine particle layer was 6 to 7 μm in all cases.

(6) Adsorption of Dye

The support having a porous semiconductor fine particle layer formed thereon was immersed in a dye solution for adsorption prepared in the same manner as in Example 1, and the support was left immersed under stirring for 3 hours at 40° C.

The dye was adsorbed to the semiconductor fine particle layer as such, and thereby a dye-sensitized electrode to be used in a photosensitive layer (photosensitive electrode) was produced.

(7) Evaluation of Photoelectrochemical Cell

A photoelectrochemical cell was produced in the same manner as in Example 1, using the dye-adsorbed semiconductor fine particle electrode described above, and the photoelectric conversion efficiency was measured. The results are presented in Table 2.

TABLE 2

| | Condition for producing cell | | | | | Cell performance | |
| Sample No. | Semiconductor fine particles | Electrically conductive support | Sensitizing dye | Content of solids excluding semiconductor fine particles in coating liquid (mass %) | Heat treatment after coating/ UV treatment | Conversion efficiency (%) | Remarks |
| --- | --- | --- | --- | --- | --- | --- | --- |
| 12 | a | PEN | A-1 | 0.3 | 120° C. UV treatment | 2.1 | This invention |
| 13 | a | PEN | A-2 | 0.3 | 120° C. UV treatment | 2.3 | This invention |
| 14 | a | PEN | A-4 | 0.3 | 120° C. UV treatment | 2.3 | This invention |
| 15 | a | PC | A-15 | 0.3 | 120° C. UV treatment | 2.2 | This invention |
| 16 | a | PEN | A-20 | 0.3 | 120° C. UV treatment | 2.3 | This invention |
| 17 | a | PC | A-2 | 0.3 | 90° C. UV treatment | 1.6 | This invention |
| 18 | a | PEN | A-4 | 0.3 | 90° C. UV treatment | 1.7 | This invention |
| 19 | a | PEN | A-15 | 0.3 | 90° C. UV treatment | 1.8 | This invention |
| 20 | a | PEN | A-2 | 0.3 | 150° C. UV treatment | 2.1 | This invention |
| 21 | a | PEN | A-4 | 0.3 | 150° C. UV treatment | 2.2 | This invention |
| 22 | a | PEN | A-15 | 0.3 | 150° C. UV treatment | 2.2 | This invention |
| 23 | a | PEN | A-4 | 0.3 | 200° C. UV treatment | 1.4 | This invention |
| 24 | a | PEN | A-15 | 0.3 | 200° C. UV treatment | 1.5 | This invention |
| 25 | a | PEI | A-20 | 0.3 | 200° C. UV treatment | 1.3 | This invention |
| 26 | a | PEN | A-1 | 8.0 | 120° C. UV treatment | 1.0 | This invention |
| 27 | a | PEN | R-1 | 0.3 | 120° C. UV treatment | 0.6 | Comparative example |
| 28 | a | PC | R-1 | 0.3 | 90° C. UV treatment | 0.3 | Comparative example |
| 29 | a | PEN | R-1 | 0.3 | 150° C. UV treatment | 0.6 | Comparative example |
| 30 | a | PEN | R-1 | 0.3 | 200° C. UV treatment | 0.4 | Comparative example |
| 31 | a | PEN | A-1 | 12.0 | 120° C. UV treatment | 0.1 | Comparative example |

As shown in Table 2, when a porous semiconductor fine particle layer adsorbed with the specific dye was formed on a support made of an electrically conductive polymer, an electrochemical cell having a photoelectric conversion efficiency of a practically useful level was obtained (sample Nos. 12 to 26). Particularly, when a porous semiconductor fine particle layer was produced by applying, on a support, a dispersion liquid having a content of solids excluding semiconductor fine particles of 0.3 mass %, conducting a heat treatment at 120 to 150° C., subsequently irradiating the dispersion liquid coating with ultraviolet radiation, and then adsorbing the specific dye thereto, the photoelectric conversion efficiency was 2% or more (sample Nos. 12 to 16 and 20 to 22).

Furthermore, it was found that when a porous semiconductor fine particle layer was produced by applying a dispersion liquid having a solids content of 10% by mass or less on a support made of an electrically conductive polymer and heating the dispersion liquid coating, and the dye for use in the present invention was adsorbed thereto, a photoelectrochemical cell having high conversion efficiency was obtained, as compared with the case where a comparative dye was adsorbed (comparison of sample Nos. 12 to 26 and sample Nos. 27 to 30). When a porous semiconductor fine particle layer was used by applying a dispersion liquid having a solids content of more than 10% by mass on a support made of an electrically conductive polymer and heating the dispersion liquid coating, even though the dye for use in the present invention was adsorbed, the photoelectric conversion efficiency was decreased so much to 0.1% (sample No. 31).

As discussed above, a dye-sensitized type photoelectric conversion element can be produced at low cost by using a porous semiconductor fine particle layer produced by the production method of the present invention, as a photosensitive layer, without necessitating a process of heating at high temperature. Furthermore, a device having a performance useful even as a photoelectrochemical cell can be provided with high conversion efficiency, using a substrate excellent in flexibility, such as an electrically conductive polymer.

Having described our invention as related to the present embodiments, it is our intention that the invention not be limited by any of the details of the description, unless otherwise specified, but rather be construed broadly within its spirit and scope as set out in the accompanying claims.

What we claim is:

1. A method of producing a photoelectric conversion element, which the photoelectric conversion element comprises a laminated structure including:
   an electrically conductive support;
   a photosensitive layer having porous semiconductor fine particles that have adsorbed a dye, formed on the electrically conductive support;
   a charge transfer layer; and
   a counter electrode;
comprising the steps of:
   applying a semiconductor fine particle dispersion liquid, in which the content of solids excluding semiconductor fine particles is 10% by mass or less based on the total amount of the semiconductor fine particle dispersion liquid, on the electrically conductive support, to form a coating;
   heating the coating, to obtain porous semiconductor fine particles; and
   sensitizing the porous semiconductor fine particles by adsorption of a dye represented by formula (2):

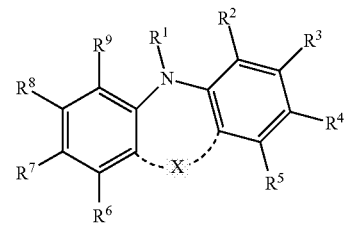

Formula (2)

wherein X represents a group of non-metallic atoms necessary for forming a nitrogen-containing 7-membered ring by linking with the benzene rings; $R^1$ represents a hydrogen atom, an aliphatic group, an aromatic group or a heterocyclic group that is linked with the nitrogen atom via a carbon atom; $R^2$ to $R^9$ each independently represent a hydrogen atom or a substituent; and at least one of $R^2$ to $R^9$ represents a dye residue represented by formula (3) and/or the group of non-metallic atoms represented by X has a dye residue represented by formula (3):

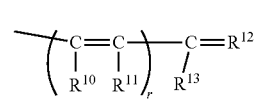

Formula (3)

wherein $R^{10}$, $R^{11}$ and $R^{13}$ each independently represent a hydrogen atom, an aliphatic group, an aromatic group or a heterocyclic group; r represents an integer of 0 or more; the carbon-carbon double bonds in formula (3) may be any of an E-form and a Z-form; and $R^{12}$ is represented by formula (7) or (12):

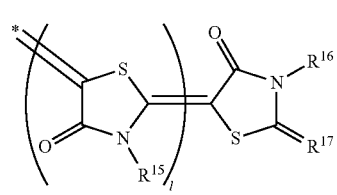

Formula (7)

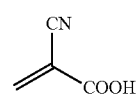

Formula (12)

wherein $R^{15}$ and $R^{16}$ each independently represent an aliphatic group, an aromatic group, or a heterocyclic group, each of which may have an acidic group; l represents 0 or 1; the carbon-carbon double bonds in formula (7) may be any of an E-form or a Z-form; $R^{17}$ represents a sulfur atom or a group represented by formula (9); and at least one of $R^{15}$, $R^{16}$ and $R^{17}$ is a group having at least one acidic group;

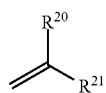

Formula (9)

wherein $R^{20}$ and $R^{21}$ each independently represent a cyano group or an acidic group, and may be identical with or different from each other; and the carbon-carbon double bond in formula (9) may be any of an E-form or a Z-form.

2. The method of producing a photoelectric conversion element according to claim 1, wherein the electrically conductive support is formed of an electrically conductive polymeric material.

3. The method of producing a photoelectric conversion element according to claim 2, wherein the electrically conductive polymeric material is at least one kind of member selected from the group consisting of polyethylene naphthalate, polycarbonate and polyether imide.

4. The method of producing a photoelectric conversion element according to claim 1, wherein the electrically conductive support applied with the semiconductor fine particle dispersion liquid is heated at a temperature ranging from 100° C. to 250°.

5. The method of producing a photoelectric conversion element according to claim 4, wherein the temperature for heating the electrically conductive support is from 100° C. to 150° C.

6. The method of producing a photoelectric conversion element according to claim 1, wherein the dye represented by formula (2) is a dye represented by any one of formulae (4) to (6):

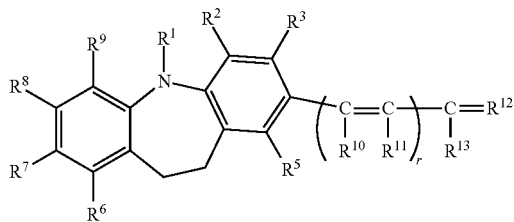

Formula (4)

wherein $R^1$ to $R^3$ and $R^5$ to $R^{13}$ in formula (4) each have the same meaning as those in formula (2) or (3), respectively;

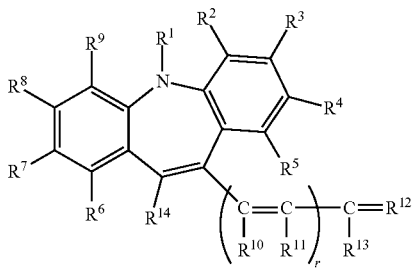

Formula (5)

wherein $R^1$ to $R^{13}$ in formula (5) each have the same meaning as those in formula (2) or (3), respectively; and $R^{14}$ represents a hydrogen atom, an alkyl group, an alkoxy group, an alkylthio group, an aryl group, an aryloxy group, an arylthio group or a heterocyclic group; and

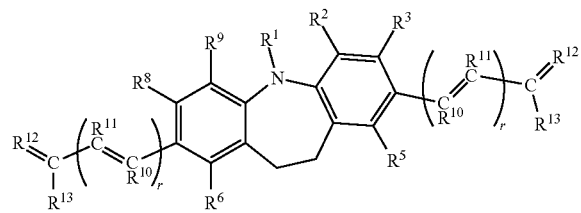

Formula (6)

wherein $R^1$ to $R^3$, $R^5$, $R^6$ and $R^8$ to $R^{13}$ in formula (6) each have the same meaning as those in formula (2) or (3), respectively.

7. The method of producing a photoelectric conversion element according to claim 1, wherein the group represented by formula (7) is a group represented by formula (10) or (11):

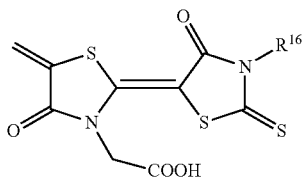

Formula (10)

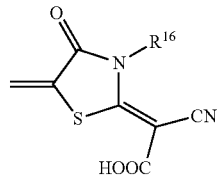

Formula (11)

wherein $R^{16}$ has the same meaning as that in formula (7).

8. The method of producing a photoelectric conversion element according to claim 1, wherein the content of solids excluding semiconductor fine particles is 0.5% by mass or less based on the total amount of the semiconductor fine particle dispersion liquid.

9. The method of producing a photoelectric conversion element according to claim 1, wherein $R^1$ in formula (2) is an alkyl group having 1 to 25 carbon atoms; and wherein r in formula (3) is 1.

10. The method of producing a photoelectric conversion element according to claim 1, wherein said step of heating the coating comprises a combination of heating the coating and activating the semiconductor fine particles in the coating by UV treatment.

* * * * *